(12) United States Patent
Ooishi

(10) Patent No.: US 6,717,881 B2
(45) Date of Patent: Apr. 6, 2004

(54) SEMICONDUCTOR MEMORY DEVICE HAVING POTENTIAL CONTROL CIRCUIT

(75) Inventor: Tsukasa Ooishi, Hyogo (JP)

(73) Assignee: Renesas Technology Corp., Tokyo (JP)

( * ) Notice: Subject to any disclaimer, the term of this patent is extended or adjusted under 35 U.S.C. 154(b) by 0 days.

(21) Appl. No.: 10/222,865

(22) Filed: Aug. 19, 2002

(65) Prior Publication Data
US 2003/0174570 A1 Sep. 18, 2003

(30) Foreign Application Priority Data
Mar. 12, 2002 (JP) ........................................ 2002-067047

(51) Int. Cl.[7] ................................................ G11C 8/00
(52) U.S. Cl. ............. 365/230.03; 365/226; 365/185.11
(58) Field of Search ........................ 365/230.03, 185.11, 365/226, 63

(56) References Cited

U.S. PATENT DOCUMENTS

| | | | |
|---|---|---|---|
| 6,011,725 A | 1/2000 | Eitan | 365/185.33 |
| 6,038,178 A * | 3/2000 | Oh | 365/230.03 |
| 6,201,737 B1 | 3/2001 | Hollmer et al. | 365/185.16 |
| 6,603,700 B2 * | 8/2003 | Aruga | 365/226 |

OTHER PUBLICATIONS

Boaz Eitan et al., "Can NROM, a 2–bit, Trapping Storage NVM Cell, Give a Real Challenge to Floating Gate Cells?", Presented at the International Conference on Solid State devices and Materials, Tokyo, 1999, pp. 1/3–3/3.

* cited by examiner

*Primary Examiner*—Tan T. Nguyen
(74) *Attorney, Agent, or Firm*—McDermott, Will & Emery

(57) ABSTRACT

If data is to be written to a specific memory cell in each of two adjacent memory cell array blocks, a switch control circuit and a supply circuit supply a first predetermined potential to a first bit line out of first and second bit lines connected to the specific memory cell and supply a second predetermined potential to the second bit line in one memory cell array block. In addition, the first predetermined potential is supplied to the second bit line and the second predetermined potential is supplied to the first bit line in the other memory cell array block. Due to this, this semiconductor memory device can improve throughput while suppressing a current which unnecessarily occurs during data write.

7 Claims, 27 Drawing Sheets

SEMICONDUCTOR MEMORY DEVICE HAVING POTENTIAL CONTROL CIRCUIT

BACKGROUND OF THE INVENTION

1. Field of the Invention

The present invention relates to a semiconductor memory device, and more particularly to a semiconductor memory device having a plurality of conductive lines in a memory cell array connected to a plurality of memory cells arranged in two adjacent column directions, respectively.

2. Description of the Background Art

Attention is paid to an NROM (Nitride Read Only Memory) type flash EEPROM (to be referred to as "NROM" hereinafter) which is a kind of a flash EEPROM among nonvolatile semiconductor memory devices. NROM is reported in U.S. Pat. Nos. 6,011,725 and 6,201,737.

FIG. 23 is a circuit diagram showing the configuration of the memory cell array of a conventional nonvolatile semiconductor memory device.

Referring to FIG. 23, the memory cell array includes a plurality of nonvolatile memory cells MC, a plurality of bit lines BL and a plurality of word lines WL.

Plural word lines WL and plural bit lines BL are arranged in row and column directions, respectively.

Each of plural nonvolatile memory cells MC is arranged to correspond to the intersection between word line WL and bit lie BL. Plural nonvolatile memory cells MC arranged in the same row are connected in series and the gates thereof are connected to same word line WL. Each bit line BL is arranged to pass through the connection point between two adjacent nonvolatile memory cells MC.

Nonvolatile memory cell MC includes two storage regions L1 and L2.

Data write and read operations for wiring and reading data to and from storage regions L1 and L2 of nonvolatile memory cell MC will next be described.

FIGS. 24A to 24D are views showing the data write or read operation for writing or reading data to and from the two storage regions in nonvolatile memory cell MC.

Referring to FIG. 24A, the gate of nonvolatile memory cell MC is connected to word line WL. Nonvolatile memory cell MC is assumed to be connected to bit lines BL0 and BL1. Nonvolatile memory cell MC has storage region L1 on a bit line BL0 side and storage region L2 on a bit line BL1 side as shown in FIG. 24C.

The write operation for writing data to storage region L1 will first be described. Referring to FIG. 24A, if data is to be written to storage region L1, the potential of bit line BL0 is kept to be a write potential VCCW and that of bit line BL1 is kept to be a ground potential GND. As a result, a write current Ifw is carried from bit line BL0 to bit line BL1 through nonvolatile memory cell MC. At this moment, data is written to storage region L1. Such a write operation for writing data to storage region L1 in nonvolatile memory cell MC will be referred to as "forward write".

Next, the read operation for reading data from storage region L1 will be described. Referring to FIG. 24B, if data is to be read from storage region L1, the potential of bit line BL0 is kept to be ground potential GND and that of bit line BL1 is kept to be read potential VCCR. As a result, a read current Ifr is carried from bit line BL1 to bit line BL0. At this moment, data is read from storage region L1. Such a read operation for reading data from storage region L1 in nonvolatile memory cell MC will be referred to as "forward read".

As can be seen, the direction of the current flowing during the write operation is opposite to that of the current flowing during the read operation in storage region L1.

The write operation for writing data to storage region L2 will next be described. Referring to FIG. 24C, if data is to be written to storage region L2, the potential of bit line BL0 is kept to be ground potential GND and that of bit line BL1 is kept to be write potential VCCW. As a result, a write current Irw is carried from bit line BL1 to bit line BL0. At this moment, data is written to storage region L2. Such a write operation for writing data to storage region L2 in nonvolatile memory cell MC will be referred to as "reverse write".

Next, the read operation for reading data from storage region L2 will be described. Referring to FIG. 24D, if data is to be read from storage region L2, the potential of bit line BL0 is kept to be read potential VCCR and that of bit line BL1 is kept to be ground potential GND. As a result, a read current Irr is carried from bit line BL0 to bit line BL1. At this moment, data is read from storage region L2. Such a read operation for reading data from storage region L2 in nonvolatile memory cell MC will be referred to as "reverse read".

As can be seen, the direction of the current flowing during the write operation is opposite to that of the current flowing during the read operation in storage region L2 as in the case of storage region L1. Further, the direction of the current flowing during the write operation for writing data to storage region L1 is opposite to that of the current flowing during the write operation for writing data to storage region L2. Likewise, the direction of the current during the read operation for reading data from storage region L1 is opposite to that of the current flowing during the read operation for reading data from storage region L2.

Therefore, it is important to control the potentials of respective bit lines BL during the write operation of NROM.

However, U.S. Pat. Nos. 6,011,725 and 6,201,737 fail to describe the peripheral circuits of a memory cell array which control the potentials of respective bit lines BL.

In addition, in flash EEPROM represented by NROM, the bit lines are formed, as diffused bit lines, on the main surface of a semiconductor substrate.

FIG. 25 is a plan view of conventional flash EEPROM.

Referring to FIG. 25, the nonvolatile semiconductor memory device has a plurality of bit lines BL arranged in a column direction. Plural bit lines BL are diffused bit lines formed on the main surface of the semiconductor substrate. Plural word lines WL are arranged in a row direction on plural bit lines BL. A plurality of metal wirings ML are arranged in the column direction on plural word lines WL. Plural metal wirings ML are arranged to correspond to plural bit lines BL, respectively and corresponding metal wiring ML and bit line BL are connected to each other through a plurality of contact sections 20.

FIG. 26 is a cross-sectional view taken along line XXVI—XXVI of FIG. 25.

Referring to FIG. 26, an n type diffused region 22 is formed on the main surface of a semiconductor substrate 21. This n type diffused region 22 corresponds to bit line BL shown in FIG. 25.

On the main surface of semiconductor substrate 21, insulating films 23a to 23d are formed at predetermined intervals. A word line WL1 is formed on insulating film 23a. A word line WL2 is formed on insulating film 23b. A word line WL3 is formed on insulating film 23c. A word line WL4 is formed on insulating film 23d. Word lines WL1 to WL4 are formed out of, for example, silicon.

On the main surface of semiconductor substrate 21, an interlayer insulating film 24 is formed in a region located on n type diffused region 22 on word lines WL1 to WL4 on the main surface of semiconductor substrate 21. Metal wiring ML is formed on interlayer insulating film 24.

Contact holes 25a and 25b are formed in a region located between insulating films 23b and 23c on n type diffused region 22. The surface of n type diffused region 22 is exposed to the bottom of each of contact holes 25a and 25b. Metal wiring ML is extended to the respective bottoms of contact holes 25a and 25b and connected to n type diffused region 22.

FIG. 27 is an explanatory view for a write operation for writing data to a nonvolatile memory cell in the memory cell array shown in FIG. 23.

Referring to FIG. 27, a case where H-level data is written to storage region L1 of a nonvolatile memory cell MC1 shown therein will be described.

Word line WL1 is selected, the potential of bit line BL0 is kept to write potential VCCW and that of bit lie BL2 is kept to be ground potential GND. In nonvolatile memory cell MC1, therefore, write current Ifw is carried from a node connected to bit line BL1 to a node connected to bit line BL2. As a result, data is written to storage region L1.

At this moment, when attention is paid to a nonvolatile memory cell MC0 adjacent nonvolatile memory cell MC1, an unnecessary current I1 is carried to nonvolatile memory cell MC0 if the potential of bit line BL0 is lower than that of bit line BL1. Unnecessary current I1 may possibly not only prevent power saving but also cause the memory cell array to malfunction.

Furthermore, according to the conventional art, data of 1 bit can be written to a memory cell at one time in the nonvolatile semiconductor memory device represented by NROM and throughput is thereby disadvantageously low.

Moreover, the nonvolatile semiconductor memory device having the cross section shown in FIG. 26 has the following disadvantages.

In semiconductor memory device manufacturing steps, plural word lines WL are normally formed at predetermined intervals. As shown in FIG. 26, however, if it is necessary to form contact holes 25a and 25b, contact holes 25a and 25b should be formed in a region in which word lines WL would be normally formed. This makes it impossible to secure the continuity of the shapes of a plurality of word lines.

In this case, word lines WL2 and WL3 shown in FIG. 26 may possibly be formed differently from other plural word lines WL, with the result that manufacturing irregularity occurs. To prevent such manufacturing irregularity, there is proposed a method of forming dummy word lines WLD1 and WLD2 between word lines WL2 and WL3 as shown in FIG. 27. If such dummy word lines are formed, the stability of the manufacturing steps of the semiconductor memory device. On the other hand, however, the area of the memory cell array increases.

In addition, although resistance can be decreased by connecting metal wiring ML to bit line BL through contact holes 25a and 25b, the conductivity depends on the diameters of contact holes 25a and 25b. Besides, as the contact holes are longer, the probability of causing poor opening under some influence increases.

SUMMARY OF THE INVENTION

It is an object of the present invention to provide a semiconductor memory device capable of suppressing a current which unnecessarily occurs during data write. It is another object of the present invention to provide a semiconductor memory device capable of improving throughput.

It is another object of the present invention to provide a semiconductor memory device capable of obtaining a low resistance of a bit line.

It is further another object of the present invention to provide a semiconductor memory device capable of reducing an area of a memory cell array.

A semiconductor memory device according to the present invention includes: a plurality of word lines; a plurality of bit lines; a plurality of memory cells; a plurality of potential supply lines; and a potential control circuit. A plurality of word lines are arranged in a row direction. A plurality of bit lines are arranged in a column direction. A plurality of memory cells are arranged in the row direction and the column direction. A plurality of potential supply lines are connected to a plurality of corresponding bit lines among the plurality of bit lines, respectively. A potential control circuit supplies a plurality of predetermined potentials corresponding to the plurality of bit lines through the plurality of potential supply lines, respectively. Each of the plurality of bit lines is connected to the plurality of memory cells arranged in the two adjacent columns.

As a result, even with a memory cell array structure in which the two adjacent memory cells are connected to a common bit line, write and read operations can be conducted to selected memory cells.

A semiconductor memory device according to the present invention includes: a plurality of memory cell array blocks; and a plurality of potential control circuits. A plurality of memory cell array blocks are arranged in a column direction. A plurality of potential control circuits are arranged in the column direction to correspond to the plurality of memory cell array blocks, respectively. Each of the plurality of memory cell array blocks includes: a plurality of word lines arranged in a row direction; a plurality of bit lines arranged in the column direction; and a plurality of memory cells arranged in the row direction and the column direction. The plurality of memory cells arranged in the row directions are connected in series and gates of the plurality of memory cells are connected to the word lines arranged in the row direction, respectively. Each of the plurality of bit lines is connected to two adjacent memory cells arranged in the column direction. Each of the potential control circuit supplies a first predetermined potential to a first bit line connected to a selected memory cell and supplies a second predetermined potential to a second bit line, among the plurality of bit lines in the corresponding memory cell array block. Another potential control circuit adjacent the potential control circuit supplies the second predetermined potential to the first bit line and supplies the first predetermined potential to the second bit line in the corresponding memory cell array block.

As a result, it is possible to simultaneously conduct write and read operations to a plurality of memory cells. Throughput is thereby improved. In addition, the flow of an unnecessary current carried between the selected memory cells can be prevented.

A semiconductor memory device according to the present invention is a semiconductor memory device including a first conductive type semiconductor substrate having a main surface and a memory cell array. The memory cell array includes: a plurality of conductive layers of a second conductive type; a plurality of word lines; a plurality of conductive lines; a plurality of conductive layers of a second conductive type formed on the main surface of the semiconductor substrate, and arranged in a column direction; a plurality of memory cells; and a plurality of pile driving sections. A plurality of word lines are arranged in a row direction. A plurality of conductive lines are formed on an upper layer of the plurality of word lines, arranged in the column direction, and each includes a plurality of conductive segments. A plurality of memory cells are arranged to correspond to intersections between the word lines and the conductive lines, respectively. A plurality of pile driving sections are formed on the conductive layers, respectively. Each of the plurality of pile driving sections includes: a second conductive layer formed on each of the conductive layers on the main surface of the semiconductor substrate; and a plurality of contact sections formed between the second conductive layer and the conductive segments.

Therefore, according to conventional semiconductor memory device manufacturing steps, it is impossible to secure the continuity of the shapes of a plurality of word lines. However, by inserting the pile driving sections, it is possible to secure the continuity of the shapes of the word lines. It is, therefore, unnecessary to form a dummy word line or the like. Furthermore, since the pile driving sections are formed on the diffused bit lines formed on the main surface of the semiconductor substrate, respectively, it is possible to decrease resistance. Moreover, since the presence of the pile driving sections enables shortening the length of each contact hole compared with that of the conventional contact hole, the probability of causing the poor opening of the contact holes in the manufacturing steps is greatly decreased and manufacturing irregularity is decreased. In addition, since the contact can be shortened and the resistance is decreased by the presence of the pile driving sections, the contact can be made small in size and a layout margin increases, accordingly. Therefore, it is possible to form a plurality of contacts in the same region compared with the conventional method. Consequently, even if one of the contacts formed in the same region causes poor opening under some influence, it is possible to secure the opening by the other contacts. As a result, it is possible to improve yield.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

The embodiments of the present invention will be described hereinafter in detail with reference to the drawings. It is noted that same or corresponding sections are denoted by the same reference symbols, respectively and will not be repeatedly described.

First Embodiment

Figure 1:
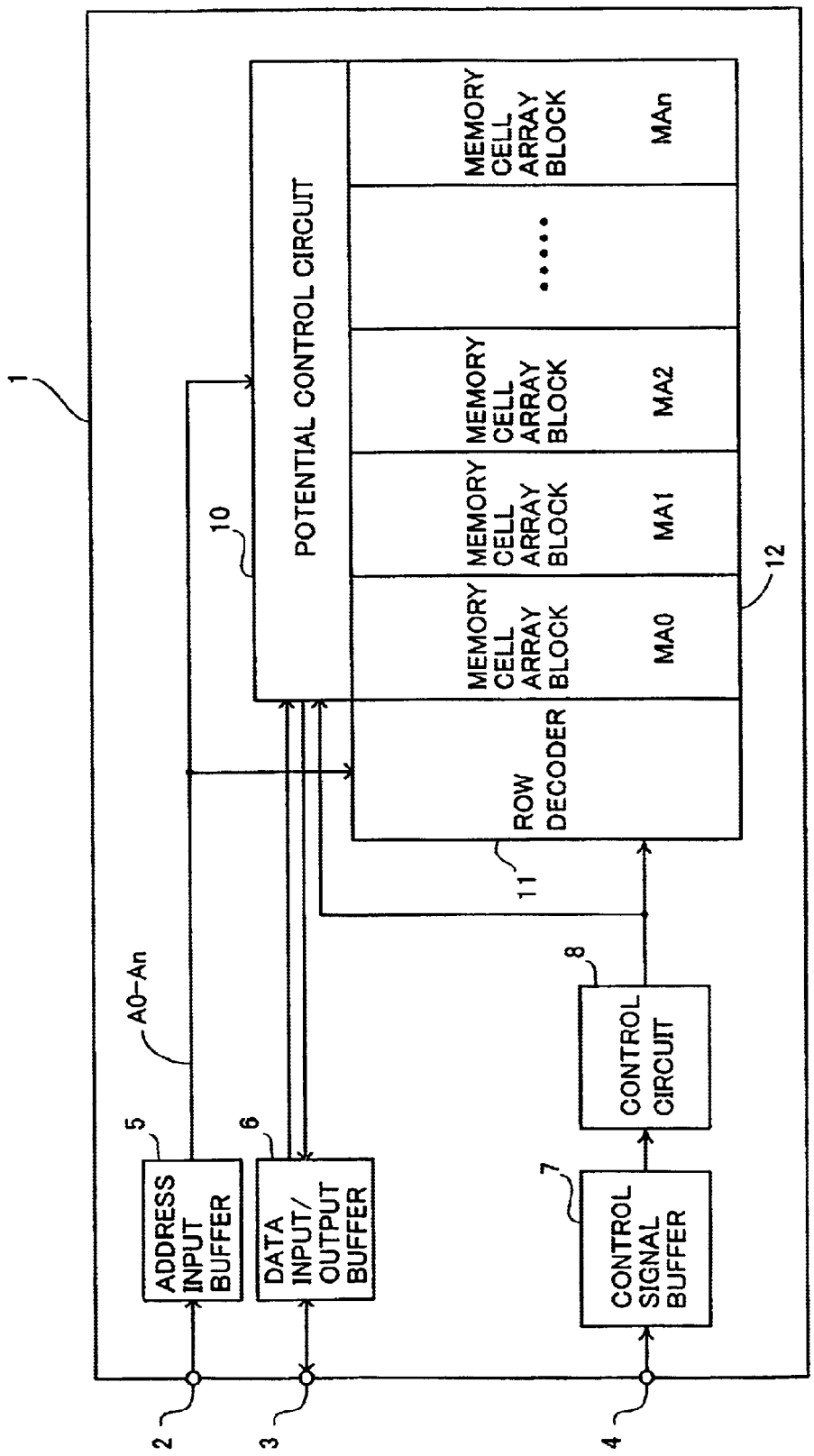
FIG. 1 is a schematic block diagram showing the overall configuration of a nonvolatile semiconductor memory device in the first embodiment of the present invention.

FIG. 1 is a schematic block diagram showing the configuration of a nonvolatile semiconductor memory device in the first embodiment of the present invention.

Referring to FIG. 1, a nonvolatile semiconductor memory device 1 includes an address signal input terminal 2, a data signal terminal 3, a control signal input terminal 4, an address input buffer 5, a data input/output buffer 6, a control signal buffer 7, a control circuit 8, a potential control circuit 10, a row decoder 11, and a memory cell array 12.

Address input buffer 5 receives external address signals inputted from address signal input terminal 2 and outputs internal address signals A0 to An. Data input/output buffer 6 transmits and receives data to and from the outside of memory 1 through data signal terminal 3.

Control signal buffer 7 receives an external control signal inputted from control signal input terminal 4 and outputs an internal control signal. Control circuit 8 receives the internal control signal outputted from control signal buffer 7 and outputs various signals for controlling the entirety of memory cell array 12.

Memory cell array 12 includes a plurality of memory cell array blocks MA0 to MAn. Each memory cell array block MA includes a plurality of word lines arranged in a row direction, a plurality of bit lines arranged in a column direction, and a plurality of nonvolatile memory cells arranged in a matrix.

Row decoder 11 receives internal address signals A0 to An outputted from address input buffer 5, and selects a word line in memory cell array 12.

Potential control circuit 10 receives internal address signals A0 to An, and selects a plurality of bit lines in memory cell array 12 during a write operation or a read operation.

Figure 2:
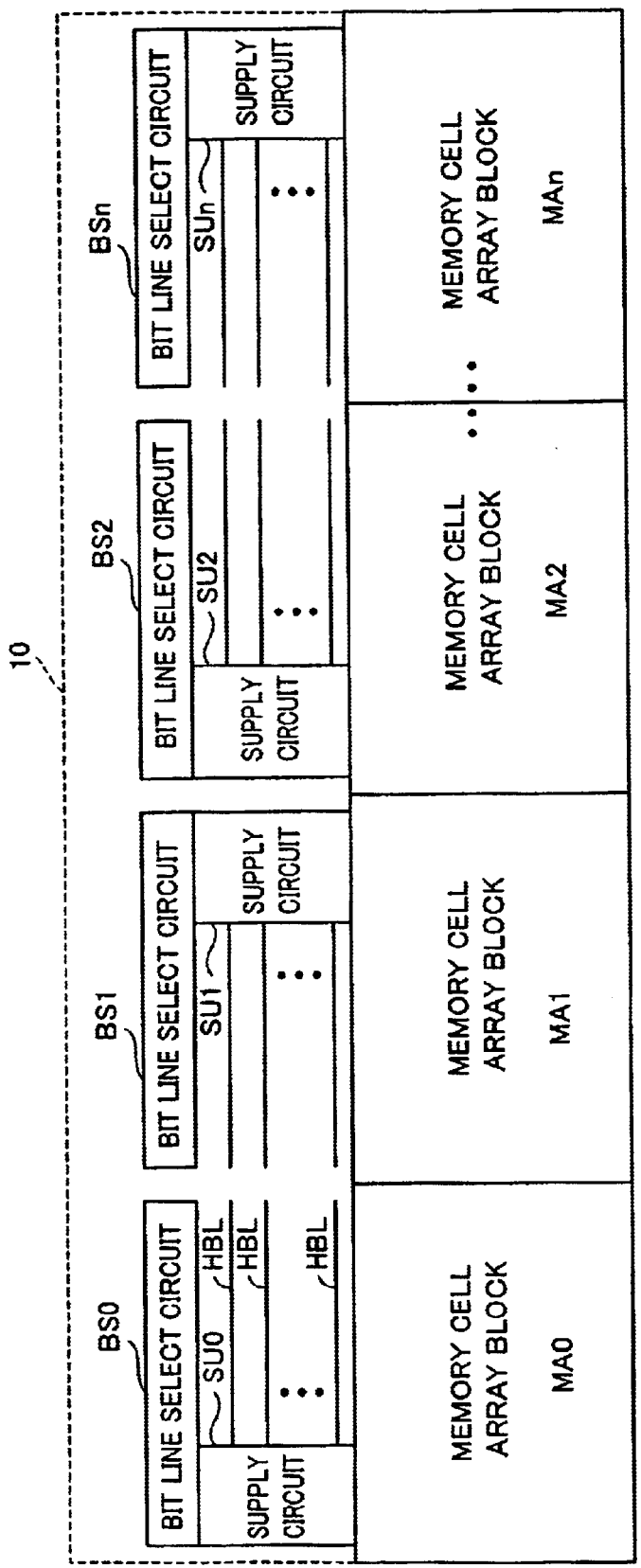
FIG. 2 is a block diagram showing the detailed configurations of a memory cell array and a potential control circuit shown in FIG. 1.

FIG. 2 is a block diagram showing the detailed configurations memory cell array 12 and potential control circuit 10 shown in FIG. 1.

Referring to FIG. 2, potential control circuit 10 includes a plurality of bit line select circuits BS and a plurality of supply circuits SU corresponding to a plurality of memory cell array blocks MA, respectively. A bit line select circuit BS0 and a supply circuit SU0 are arranged to correspond to memory cell array block MA0. Bit line select circuit BS0 selects a plurality of bit lines in memory cell array block MA0 during a write operation or a read operation. Supply circuit SU0 is connected to a plurality of potential supply lines HBL. Supply circuit SU0 supplies predetermined potentials to a plurality of bit lines selected by bit line select circuit BS0 through potential supply circuits HBL, respectively.

Likewise, a bit line select circuit BS1 and a supply circuit SU1 are arranged to correspond to memory cell array block MA1. In addition, a bit line select circuit BS2 and a supply circuit SU2 are arranged to correspond to memory cell array block MA2. A bit line select circuit BSn and a supply circuit SUn are arranged to correspond to memory cell array block MAn.

Figure 3:
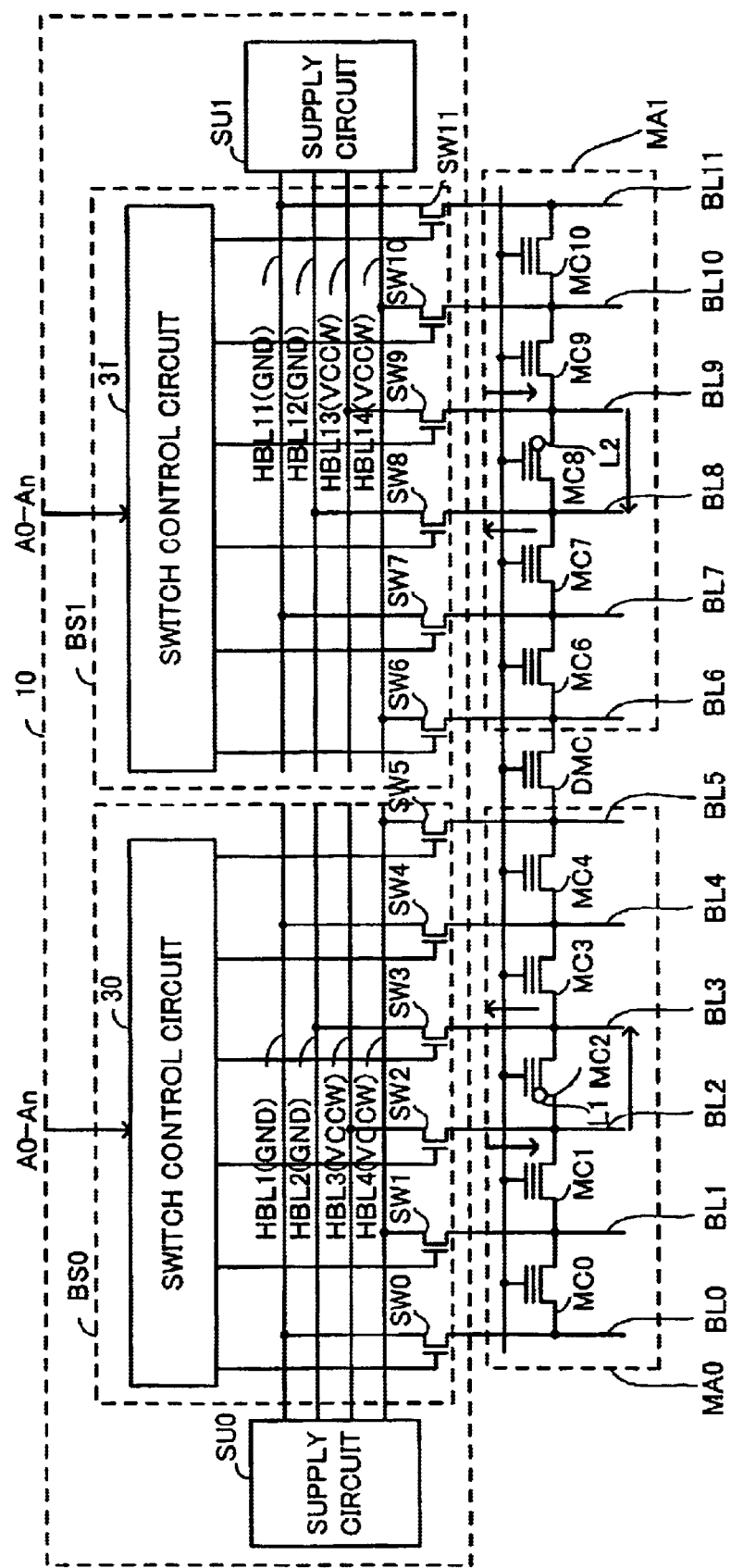
FIG. 3 is a block diagram showing the detailed configurations of memory cell array blocks and the potential control circuit shown in FIG. 2.

FIG. 3 is a block diagram showing the detailed configurations of memory cell array blocks MA0 and MA1 and potential control circuit 10 shown in FIG. 2.

Referring to FIG. 3, memory cell array block MA0 includes word line WL arranged in the row direction and bit lines BL0 to BL5 arranged in the column direction. In addition, memory cell array block MA0 includes a plurality of nonvolatile memory cells MC0 to MC4.

Nonvolatile memory cell MC0 is connected between bit lines BL0 and BL1 and the gate thereof is connected to word line WL. Memory cell MC1 is connected between bit lines BL1 and BL2 and the gate thereof is connected to word line WL. Likewise, memory cell MC3 is connected between bit lines BL3 and BL4, memory cell MC4 is connected between bit lines BL4 and BL5, and the gates of memory cells MC2 to MC4 are connected to word line WL.

Potential control circuit 10 includes supply circuit SU0 and bit line select circuit BS0 which are arranged to correspond to memory cell array block MA0, and supply circuit SU1 and bit line select circuit BS1 which are arranged to correspond to memory cell array block MA1.

Supply circuit SU0 supplies predetermined potentials to potential supply lines HBL1 to HBL4, respectively. Potential supply lines HBL1 to HBL4 are arranged in parallel to word line WL.

Bit line select circuit BS0 includes a plurality of switch circuits SW0 to SW5 and a switch control circuit 30 which controls a plurality of switch circuits SW0 to SW5.

Switch control circuit 30 receives internal address signals A0 to An, and selects a switch circuit to be turned on.

Switch circuit SW0 is connected between bit line BL0 and potential supply line HBL1. Switch circuit SW1 is connected between bit line BL1 and potential supply line HBL4. Switch circuit SW2 is connected between bit line BL2 and potential supply line HBL3. Switch circuit SW3 is connected between bit line BL3 and potential supply line HBL2. Switch circuit SW4 is connected between bit line BL4 and potential supply line HBL1. Switch circuit SW5 is connected between bit line BL5 and potential supply line HBL4. The gates of switch circuits SW0 to SW5 are all connected to switch control circuit 30.

Memory cell array block MA1 includes word line WL, a plurality of bit lines BL6 to BL11, and a plurality of nonvolatile memory cells MC6 to MC10. Word line WL is the same as word line WL arranged in memory cell array block MA0. Memory cell MC6 is connected between bit line BL6 and bit line BL7. Memory cell MC7 is connected between bit line BL7 and bit line BL8. Memory cell MC8 is connected between bit line BL8 and bit line BL9. Memory cell MC9 is connected between bit line BL9 and bit line BL10. Memory cell MC10 is connected between bit line BL10 and bit line BL11. The gates of plural memory cells MC6 to MC10 are all connected to word line WL.

Supply circuit SU1 supplies predetermined potentials to potential supply lines HBL11 to HBL14, respectively.

Bit line select circuit BS1 includes a plurality of switch circuits SW6 to SW11 and a switch control circuit 31 which controls a plurality of switch circuits SW6 to SW11.

Switch control circuit 31 receives internal address signals A0 to An, and selects a switch circuit to be turned on.

Switch circuit SW6 is connected between bit line BL6 and potential supply line HBL14. Switch circuit SW7 is connected between bit line BL7 and potential supply line HBL11. Switch circuit SW8 is connected between bit line BL8 and potential supply line HBL12. Switch circuit SW9 is connected between bit line BL9 and potential supply line HBL13. Switch circuit SW10 is connected between bit line BL10 and potential supply line HBL14. Switch circuit SW11 is connected between bit line BL11 and potential supply line HBL11. The gates of switch circuits SW6 to SW11 are all connected to switch control circuit 31.

As can be seen from the above, if bit line select circuits BS0 and BS1 are compared, it is understood that the connection relationship between a plurality of switch circuits and a plurality of potential supply lines in the bit line select circuits are symmetrical between the memory cell array blocks.

A dummy memory cell DMC is arranged between memory cell array blocks MA0 and MA1. Dummy memory cell DMC is connected between bit lines BL5 and BL6 and the gate thereof is connected to word line WL. Dummy memory cell DMC is a memory which does not contribute to storing data. Therefore, even if the dummy memory cell is not interposed between the memory cell array blocks, no influence is given to the read and write of data. If the memory cell array blocks are completely separated from each other, however, the shapes of the memory cells located on the end portions of the respective memory cell array blocks are unstable in the manufacturing steps of the semiconductor memory device. Due to this, by inserting dummy memory cell DMC between the memory cell array blocks, it is possible to improve the stability of the finished end portions of the respective memory cell array blocks.

The write operation of the nonvolatile semiconductor memory device having the above-mentioned circuit configuration will be described.

Referring to FIG. 3, a case where H-level data is stored in storage region L1 of memory cell MC2 in memory cell array block MA0 and H-level data is stored in storage region L2 of memory cell MC8 in memory cell array block MA1 will be described.

In this case, switch control circuit 30 in bit line select circuit BS0 outputs an H-level signal to the gates of switch circuits SW1 to SW4. As a result, switch circuits SW1 to SW4 are turned on. Therefore, bit line BL1 is connected to potential supply line HBL4, bit line BL2 is connected to potential supply line HBL3, bit line BL3 is connected to potential supply line HBL2 and bit line BL4 is connected to potential supply line HBL1.

Likewise, switch control circuit 31 in bit line select circuit BS1 outputs an H-level signal to the gates of switch circuits SW7 to SW10. As a result, switch circuits SW7 to SW10 are turned on. Therefore, bit line BL7 is connected to potential supply line HBL11, bit line BL8 is connected to potential supply line HBL12, bit line BL9 is connected to potential supply line HBL13 and bit line BL10 is connected to potential supply line HBL14.

Next, supply circuit SU0 supplies predetermined potentials to potential supply lines HBL1 to HBL4, respectively, so as to store the H-level data in memory region L1 of memory cell MC2. Specifically, supply circuit SU0 supplies write potential VCCW to potential supply line HBL3 and ground potential GND to potential supply line HBL2. Therefore, the potential of bit line BL2 connected to potential supply line HBL3 is kept to be write potential VCCW and that of bit line BL3 connected to potential supply line HBL2 is kept to be ground potential GND. As a result, a current is carried from bit line BL2 to bit line BL3 of memory cell MC2. It is thereby possible to store the H-level data in storage region L1 of memory cell MC2.

Furthermore, supply circuit SU0 supplies write potential VCCW to potential supply line HBL4 and ground potential GND to potential supply line HBL1 so as not to carry an unnecessary current to memory cells MC1 and MC3 adjacent memory cell MC2. By doing so, the potentials of bit lines BL1 and BL2 connected to memory cell MC1 are both kept to be write potential VCCW. Therefore, no potential difference is generated in memory cell MC1 and no current flows to memory cell MC1. Likewise, the potentials of bit lines BL3 and BL4 connected to memory cell MC3 are kept to be ground potential GND. As a result, no current flows to memory cell MC3. Since switch circuits SW0 and SW5 are turned off, bit lines BL0 and BL5 are in a floating state.

Likewise, supply circuit SU1 supplies predetermined potentials to potential supply lines HBL11 to HBL14, respectively, so as to write H-level data to storage region L2 of memory cell MC8.

Specifically, supply circuit SU1 supplies ground potential GND to potential supply line HBL12 and write potential VCCW to potential supply line HBL13. As a result, the potential of bit line BL9 connected to memory cell MC8 is kept to be write potential VCCW and that of bit line BL8 is kept to be ground potential GND. A current is, therefore, carried from bit line BL9 to bit line BL8 and the H-level data is stored in storage region L2 in memory cell MC8.

Furthermore, supply circuit SU1 supplies ground potential GND to potential supply line HBL11 and write potential VCCW to potential supply line HBL14. As a result, the potential of bit line BL7 connected to memory cell MC7 is kept to be ground potential GND, and the potential of bit line BL8 is also kept to be ground potential GND. Therefore, no current flows to memory cell MC7. Likewise, the potential of bit line BL10 connected to memory cell MC9 is kept to be write potential VCCW and that of bit line BL9 is also kept to be write potential VCCW. As a result, no current flows to memory cell MC9, either. Consequently, data is not erroneously written to the memory cells adjacent memory cell MC8. Since switch circuits SW6 and SW11 are turned off, bit lines BL6 and BL11 are in a floating state.

Attention is now paid to the boundary between memory cell array blocks MA0 and MA1. Bit lines BL5 and BL6 are both in a floating state and the potentials of bit lines BL4 and BL7 are both kept to be ground potential GND. As a result, in the vicinity of the boundary between memory cell array blocks MA0 and MA1, the generation of the potential difference between memory cell array blocks MA0 and MA1 is suppressed. In addition, a plurality of memory cells MC3, MC4, MC6 and MC7 and dummy memory cell DMC are interposed between memory cells MC2 and MC8 to which data is recorded. As a result, the total resistance between memory cells MC2 and MC8 becomes high. Therefore, by storing data in the memory cells of the respective blocks, a penetrating current generated between the respective memory cell blocks is quite low and the malfunction of the write operation can be thereby prevented.

In the memory cell array blocks shown in FIG. 3, a plurality of memory cell arrays are arranged in the row direction. It is also possible to arrange a plurality of memory cell arrays in the row and column directions. In addition, the number of word lines and that of bit lines in each memory cell array block are not limited. Furthermore, while the number of potential supply lines to which the supply circuits output predetermined potentials is four, four or more potential supply lines may exist.

Figure 4:
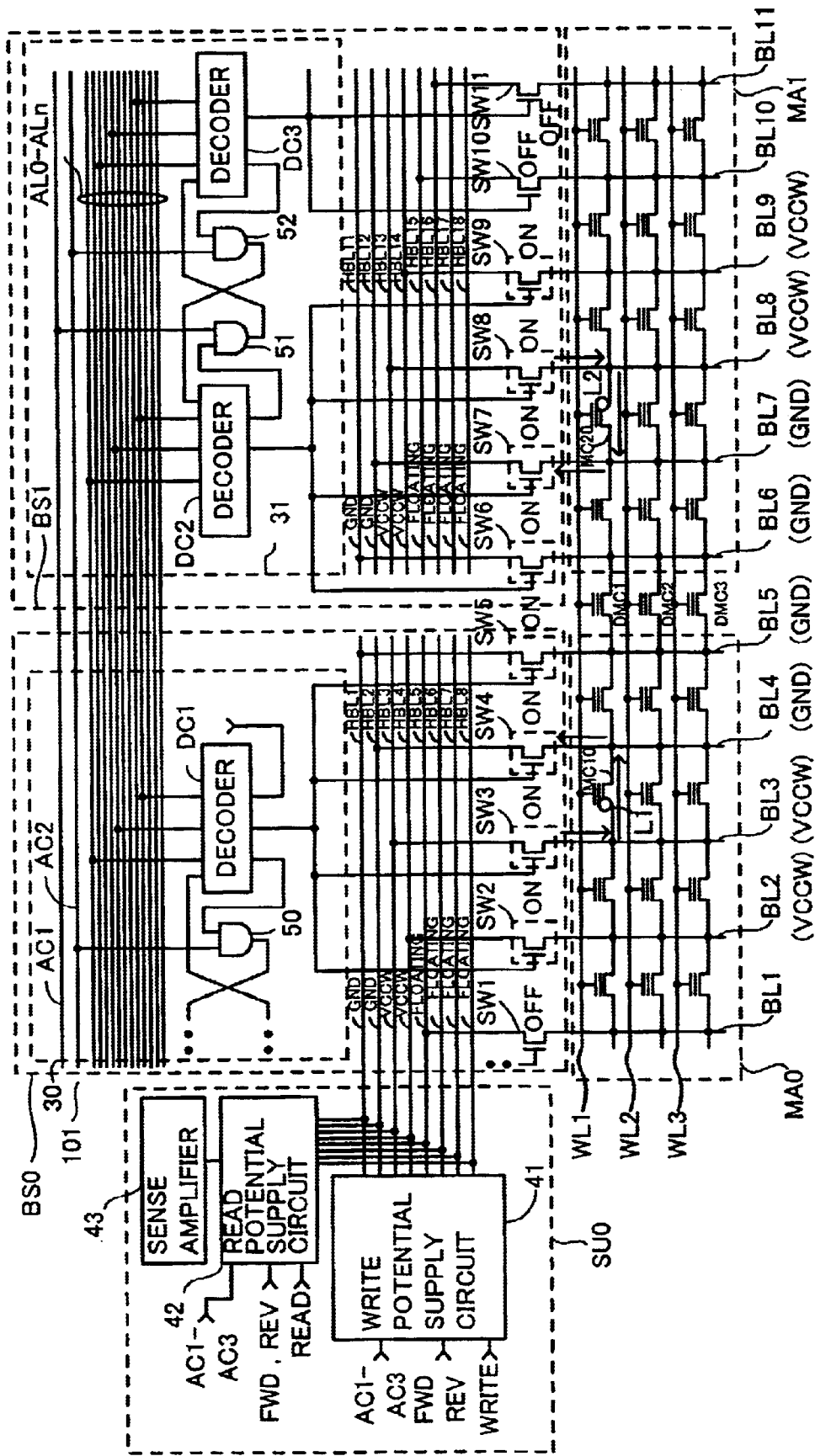
FIG. 4 is a block diagram showing the detailed configurations of the memory cell array blocks, bit line select circuits and a supply circuit if eight potential supply lines are arranged.

FIG. 4 is a block diagram showing the detailed configurations of memory cell array blocks MA0 and MA1, bit line select circuits BS0 and BS1 and supply circuit SU0 if eight potential supply lines are arranged.

Referring to FIG. 4, memory cell array block MA0 includes a plurality of word lines WL1 to WL3 and a plurality of bit lines BL1 to BL5. Word lines WL1 to WL3 are arranged in the row direction and bit lines BL1 to BL5 are arranged in the column direction. Memory cell array block MA0 has a plurality of memory cells MC arranged to correspond to the intersections between the word lines and the bit lines, respectively. Although FIG. 4 shows that memory cell array block MA0 includes three word lines and five bit lines 5, memory cell array block MA0 further includes word lines and bit lines which are not shown.

Supply circuit SU0 in bit line select circuit BS0 includes a write potential supply circuit 41, a read potential supply circuit 42 and a sense amplifier 43. Write potential supply circuit 41 supplies predetermined potentials to potential supply lines HBL1 to HBL8, respectively. Write potential supply circuit 41 receives address signals AC1 to AC3, a forward signal FWD, a reverse signal REV and a write signal WRITE, and supplies predetermined potentials to potential supply lines HBL1 to HBL8, respectively.

Here, address signals AC 1 to AC3 are address signals of lower three bits. That is, address signal AC1 is the lowest address signal. Address signal AC2 is the second lowest address signal. Address signal AC3 is the third lowest address signal.

Forward signal FWD is a control circuit which is outputted from control circuit 8 during forward write or forward read. In addition, reverse signal REV is a signal which is outputted from control circuit 8 during reverse write or reverse read. Write signal WRITE is a signal which is outputted from control circuit during a write operation.

Read potential supply circuit 42 supplies predetermined potentials to potential supply lines HBL1 to HBL8, respectively, during a read operation. Read potential supply circuit 42 receives address signals AC1 to AC3, forward signal FWD, reverse signal REV and a read signal READ, and supplies predetermined potentials to the respective potential supply lines. Here, read signal READ is a signal which is outputted from control circuit 8 during a read operation.

Switch control circuit 30 includes a decoder DC1, a plurality of decoders, not shown, a logic gate 50 and a plurality of logic gates, not shown.

Decoder DC1 is connected to a predetermined address signal line among a plurality of address signal lines AL0 to ALn transmitting the internal address signals. Decoder DC1 receives predetermined internal address signal An and the output signal of the logic gate, not shown, adjacent logic gate 50, and outputs a decoding signal. The decoding signal outputted is inputted into switch circuits SW2 to SW5 and logic gate 50 to be described later.

Logic gate 50 receives the output signal of decoder DC1 and address signal AC2, and outputs an AND logic operation result to the decoder, not shown, adjacent decoder DC1.

Bit line select circuit BS0 also includes switch circuits SW1 to SW5. The gates of switch circuits SW2 to SW5 are connected to the output terminal of decoder DC1. In addition, the gate of switch circuit SW1 is connected to the output terminal of the decoder, not shown, adjacent decoder DC1. Switch circuit SW1 is connected between bit line BL1 and potential supply line HBL5. Switch circuit SW2 is connected between bit line BL2 and potential supply line HBL4. Switch circuit SW3 is connected between bit line BL3 and potential supply line HBL3. Switch circuit SW4 is connected between bit line BL4 and potential supply line HBL2. Switch circuit SW5 is connected between bit line BL5 and potential supply line HBL1. It is noted that corresponding switch circuits, not shown, are connected to potential supply lines HBL6 to HBL8.

The configurations of memory cell array block MA1 and bit line select circuit BS1 are equal to those of memory cell array block MA0 and bit line select circuit BS0, respectively. The supply circuit, not shown, corresponding to memory cell array block MA1 supplies predetermined potentials to potential supply lines HBL11 to HBL18, respectively. Since the configuration of the supply circuit which supplies potentials to potential supply lines HBL11 to HBL18, respectively, is equal to that of supply circuit SU0, it will not be repeatedly described herein.

Memory cell array block MA1 includes bit lines BL6 to BL11 and word lines WL1 to WL3.

Memory cell array block MA1 has a plurality of nonvolatile memory cells MC arranged to correspond to the intersections between the word lines and the bit lines, respectively.

Bit line select circuit BS1 includes a plurality of switch circuits SW6 to SW11, decoders DC2 and DC3 and logic gates 51 and 52.

Switch circuit SW6 is connected between bit line BL6 and potential supply line HBL11. Switch circuit SW7 is connected between bit line BL7 and potential supply line HBL12. Switch circuit SW8 is connected between bit line BL8 and potential supply line HBL13. Likewise, switch circuit SW9 is connected between bit line BL9 and potential supply line HBL14. Switch circuit SW10 is connected between bit line BL10 and potential supply line HBL15. Switch circuit SW11 is connected between bit line BL11 and potential supply line HBL16. It is noted that corresponding switch circuits, not shown, are connected to potential supply lines HBL17 and HBL18.

The gates of switch circuits SW6 to SW9 are connected to the output terminal of decoder DC2. The gates of switch circuits SW1 and SW11 are connected to the output terminal of decoder DC3.

Logic gate 51 receives the output signal of decoder DC2 and address signal AC1, and outputs an AND logic operation result to decoder DC3. In addition, logic gate 52 receives the output signal of decoder DC3 and address signal AC2, and outputs an AND logic operation result to decoder DC2.

Decoder DC2 receives predetermined internal address signal An and the output signal of logic gate 52, and outputs a decoding signal. Decoder DC3 receives a predetermined internal address signal and the output signal of logic gate 51, and outputs a decoding signal.

In the configuration of the bit line select circuit described above, one decoder controls four switch circuits. In addition, the connection between a plurality of potential supply lines and a plurality of bit lines is such that eight continuous bit lines through a plurality of switch circuits are set as one unit and the respective potential supply lines are connected to correspond to the plural bit lines in each unit, respectively.

For example, in a semiconductor memory device in which potential supply lines HBL1 to HBL8 are arranged in memory cell array block MA0, it is assumed that bit lie BL1 is connected to correspond to potential supply line HBL1 and that bit line BL2 is connected to correspond to potential supply line HBL2. In this case, a plurality of bit lines $BL_{8m+n}$ (where n and m are natural numbers) in memory cell array block MA0 are connected to one potential supply line $HBL_n$. Since the write potential supply circuit and the read potential supply circuit supply potentials to a plurality of bit lines BL through a plurality of potential supply lines HBL, it is possible to simplify the circuit configurations of the write potential supply circuit and the read potential supply circuit, respectively. This is because it is unnecessary for the write potential supply circuit and the read potential supply circuit to control the potentials of respective bit lines BL. That is, the write potential supply circuit and the read potential supply circuit can control the potentials of respective bit lines BL by controlling the potentials of a plurality of potential supply lines HBL fewer than bit lines BL in response to the inputted address signals.

Furthermore, dummy memory cells DMC1 to DMC3 are arranged between memory cell array blocks MA0 and MA1 in the column direction.

The write operation of the nonvolatile semiconductor memory device having the above-mentioned circuit configuration will be described. Referring to FIG. 4, a case where H-level data is written to storage region L1 of memory cell MC10 of memory cell array block MA0 and H-level data is written to storage region L2 of memory cell MC20 of memory cell array block MA1, will be described.

First, decoder DC1 in bit line select circuit BS0 receives a predetermined address signal and activates a decoding signal to be outputted to H level. Likewise, decoder DC2 in bit line select circuit BS1 receives a predetermined address signal and activates a decoding signal to be outputted to H level. At this moment, a decoding signal outputted from decoder DC3 remains L level.

In bit line select circuit BS0, switch circuits SW2 to SW5 receive the H-level data outputted from decoder DC1 and are turned on. As a result, bit line BL2 is connected to potential supply line HBL4, bit line BL3 is connected to potential supply line HBL3, bit line BL4 is connected to potential supply line HBL2, and bit line BL5 is connected to potential supply line HBL1.

Likewise, in bit line select circuit BS1, switch circuits SW6 to SW9 receive the H-level data outputted from decoder DC2 and are turned on. As a result, bit line BL6 is connected to potential supply line HBL11, bit line BL7 is connected to potential supply line HBL12, bit line BL8 is connected to potential supply line HBL13, and bit line BL9 is connected to potential supply line HBL14.

Next, write potential supply circuit 41 in supply circuit SU0 supplies predetermined potentials to the respective potential supply lines. Specifically, write potential supply circuit 41 supplies ground potential GND to potential supply lines HBL1 and HBL2, and write potential VCCW to potential supply lines HBL3 and HBL4. Write potential supply circuit 41 supplies a floating potential to other potential supply lines HBL5 to HBL8.

As a result, the potentials of bit lines BL2 and BL3 are both kept to be write potential VCCW and those of bit lines BL4 and BL5 are both kept to be ground potential GND. Therefore, if word line WL1 is selected, a current is carried from bit line BL3 to bit line BL4 and H-level data is stored in storage region L1 in memory cell MC10. At this moment, the potential of bit line BL2 is kept to be write potential VCCW. As a result, no current flows to memory cells MC adjacent memory cell MC10. Further, no current flows to memory cell MC connected to bit lines BL4 and BL5 and adjacent memory cell MC10.

On the other hand, in memory cell array block MA1, the write potential supply circuit, not shown, keeps the potentials of potential supply lines HBL1 and HBL12 to be ground potential GND and those of potential supply lines HBL13 and HBL14 to be write potential VCCW. Other potential supply lines HBL15 to HBL18 are in a floating state. Therefore, the potentials of bit lines BL8 and BL9 are both kept to be write potential VCCW and those of bit lines BL6 and BL7 are both kept to be ground potential GND.

As a result from the above, if word line WL1 is selected, a current is carried from bit line BL8 to bit line BL7 and H-level data is stored in storage region L2 in memory cell MC20. In addition, the both ends of the memory cells adjacent memory cell MC20 are kept to have write potential VCCW or ground potential GND and no current flows to the adjacent memory cells.

Through the above-mentioned operation, it is possible to conduct a write operation to predetermined memory cells and no current flows to the memory cells adjacent the predetermined memory cells.

Next, the read operation of the semiconductor memory device having the circuit configuration shown in FIG. 4 will be described.

Figure 5:
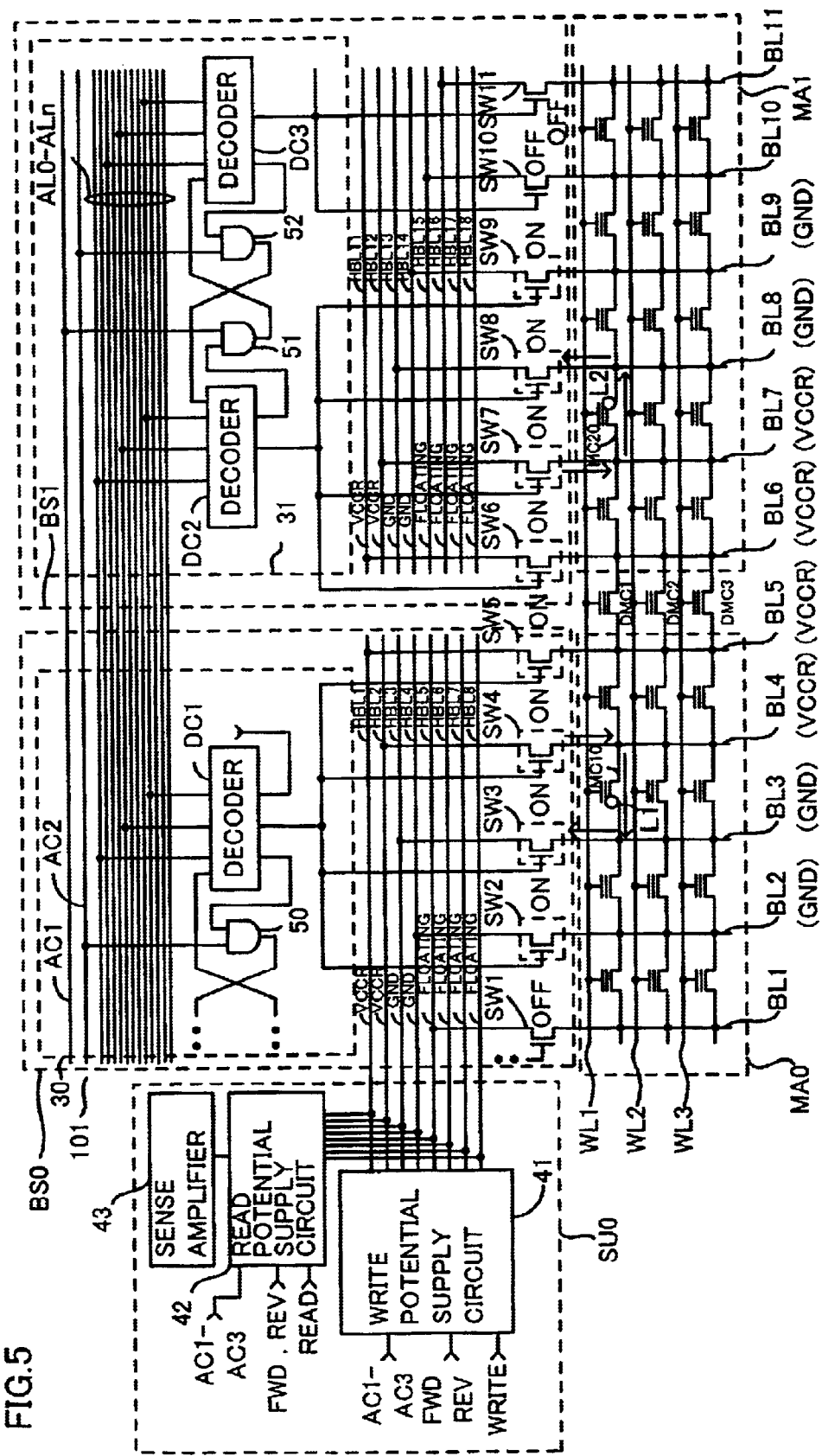
FIG. 5 is an explanatory view for the read operation of the nonvolatile semiconductor memory device shown in FIG. 4.

FIG. 5 is an explanatory view for the read operation of the semiconductor memory device shown in FIG. 4.

Referring to FIG. 5, the operations of decoders DC1 to DC3 and switch circuits SW1 to SW10 of bit line select circuits BS0 and BS1 during a read operation are equal to those during the write operation, which will not be repeatedly described herein.

During a read operation, read signal READ is activated, so that read potential supply circuit 42 in supply circuit SU0 supplies potentials to potential supply lines HBL1 to HBL8, respectively. At this moment, write signal WRITE is at L level and write potential supply circuit 41 does not, therefore, operate.

When data is to be read from storage region L1 in memory cell MC10, read potential supply circuit 42 supplies read potential VCCR to potential supply lines HBL1 and HBL2 and ground potential GND to potential supply circuits HBL3 and HBL4. Read potential supply circuit 42 supplies a floating potential to other potential supply lines HBL5 to HBL8.

As a result, the potentials of bit lines BL2 and BL3 are kept to be ground potential GND and those of bit lines BL4 and BL5 are kept to be read potential VCCR. Therefore, a current is carried from bit line BL4 to bit line BL5 and data is read from storage region L1 in memory cell MC10.

To read data from storage region L1 of memory cell MC10, sense amplifier 43 receives a current flowing in potential supply line HBL3 and amplifies the signal thereof, thereby performing a read operation. In addition, the potentials of bit lines BL2 and BL3 are kept to be ground potential GND and those of bit lines BL4 and BL5 are kept to be read potential VCCR. As a result, no current is carried to the memory cells adjacent memory cell MC10.

The same thing is true for the read operation for reading data from storage region L2 of memory cell MC20 in memory cell array block MA1.

In this case, read potential VCCR is supplied to potential supply lines HBL11 and HBL12 and ground potential GND is supplied to potential supply lines HBL13 and HBL14. Other potential supply lines HBL15 to HBL18 are kept in a floating state. Therefore, the potentials of bit lines BL6 and BL7 are kept to be read potential VCCR and those of bit lines BL8 and BL9 are kept to be ground potential GND. As a result, a current is carried from bit line BL7 to bit line BL8 and data is read from storage region L2 in memory cell MC20. Since the both ends of the memory cells adjacent the both ends of memory cell MC20 are kept to have read potential VCCR or ground potential GND, no current is carried to the adjacent memory cells.

Through the above-mentioned operations, it is possible to select a memory cell in each memory array block and, at the same time, to perform the write operation and the read operation.

In FIGS. 4 and 5, the configurations of the memory cell array blocks and the potential control circuit if eight potential supply lines are arranged are shown. The same operations can be performed if six potential supply lines are arranged.

Figure 6:
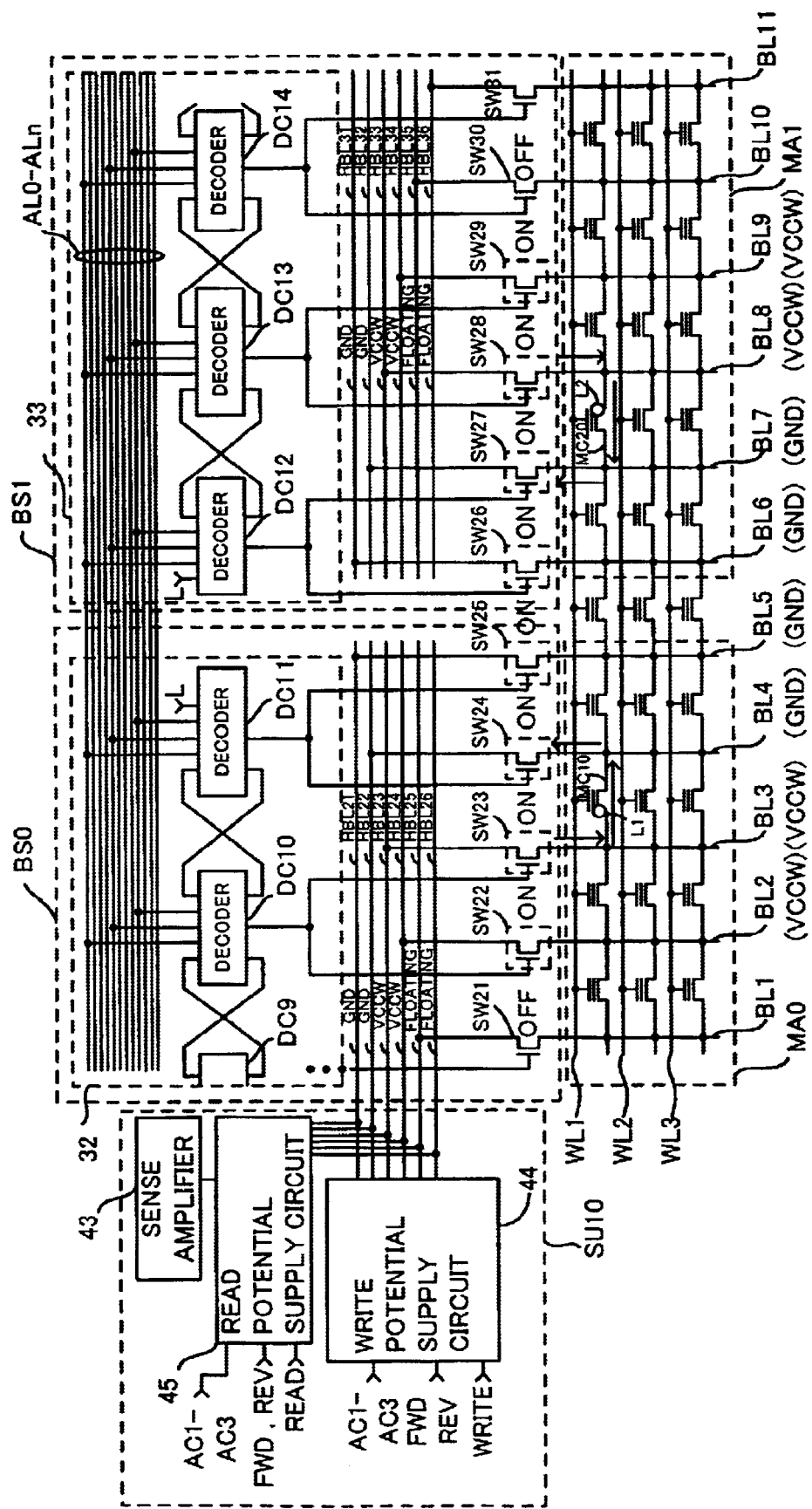
FIG. 6 is a circuit diagram showing the configuration of the potential control circuit if six potential supply lines are arranged.

FIG. 6 is a circuit diagram showing the configuration of the potential control circuit if six potential supply lines are arranged.

Referring to FIG. 6, since the configurations of memory cell array blocks MA0 and MA1 are equal to those shown in FIG. 4, they will not be repeatedly described herein.

Bit line select circuit BS0 includes a switch control circuit 32 and a plurality of switch circuits SW21 to SW25. In addition, a supply circuit SU10 includes a write potential supply circuit 44, a read potential supply circuit 45 and sense amplifier 43.

Write potential supply circuit 44 and read potential supply circuit 45 supply predetermined potentials to six potential supply lines HBL21 to HBL26 during a write operation and a read operation, respectively. The remaining configuration is equal between write potential supply circuit 41 and read potential supply circuit 42.

Switch control circuit 32 includes a plurality of decoders. A decoder DC10 receives a predetermined internal address signal among a plurality of internal address signals AL0 to ALn and decoding signals outputted from adjacent decoders DC9 and DC11, outputs a decoding signal to the gates of switch circuits SW22 and SW23 and to adjacent decoders DC9 and DC11. Decoder DC9 receives a predetermined internal address signal and decoding signals from the adjacent decoders, and outputs a decoding signal to the adjacent decoders, corresponding switch circuit SW21 and a switch circuit, not shown. Decoder DC11 receives a predetermined internal address signal and outputs a decoding signal to switch circuits SW24 and SW25 and decoder DC10.

If decoder DC10 in switch control circuit 32 is selected, for example, decoders DC9 and DC11 adjacent decoder DC10 also output H-level decoding signals.

Switch circuit SW21 is connected between bit line BL1 and potential supply line HBL25. Switch circuit SW22 is connected between bit line BL2 and potential supply line HBL24. Switch circuit SW23 is connected between bit line BL3 and potential supply line HBL23. Switch circuit SW24 is connected between bit line BL4 and potential supply line HBL22. Switch circuit SW25 is connected between bit line BL5 and potential supply line HBL21. The gate of switch circuit SW21 is connected to the output terminal of decoder DC9, those of switch circuits SW22 and SW23 are connected to the output terminal of decoder DC10, and those of switch circuits SW24 and SW25 are connected to the output terminal of decoder DC11.

The configuration of switch control circuit 33 is the same as that of switch control circuit 32. Switch control circuit 33 includes a plurality of decoders and a plurality of switch circuits SW26 to SW31. A decoder DC12 receives the output signal of decoder DC13 and a predetermined address signal, and outputs a decoding signal. Decoder DC13 receives the output signal of decoder DC12, the output signal of a decoder DC14 and a predetermined address signal, and outputs a decoding signal. Decoder DC14 receives the output signal of decoder DC13, the output signal of a decoder, not shown, adjacent decoder DC14 and a predetermined address signal, and outputs a decoding signal.

If decoder DC13 is selected in switch control circuit 33, for example, signals outputted from decoders DC12 and DC14 adjacent decoder DC13 become H level, as well.

Switch circuit SW26 is connected between bit line BL6 and potential supply line HBL31. Switch circuit SW27 is connected between bit line BL7 and potential supply line HBL32. Switch circuit SW28 is connected between bit line BL8 and potential supply line HBL33. Switch circuit SW29 is connected between bit line BL9 and potential supply line HBL34. Switch circuit SW30 is connected between bit line BL10 and potential supply line HBL35. Switch circuit SW31 is connected between bit line BL11 and potential supply line HBL36.

The gates of switch circuits SW26 and SW27 are connected to the output terminal of decoder DC12, and those of switch circuits SW28 and SW29 are connected to the output terminal of decoder DC13. In addition, the gates of switch circuits SW30 and SW31 are connected to the output terminal of decoder DC14. It is noted that potential supply lines HBL31 to HBL36 are supplied with potential from a supply circuit, not shown.

The write operation of the nonvolatile semiconductor memory device having the above-mentioned configuration will be described.

In FIG. 6, if H-level data is stored in storage region L1 of memory cell MC10 in memory cell array block MA0 and H-level data is stored in storage region L2 of memory cell MC20 in memory cell array block MA1, then decoder DC11 is selected in switch control circuit 32. As a result, both of the decoding signal outputted from decoder DC11 and that outputted from decoder DC10 become H level. Switch circuits SW22 to SW25 are, therefore, turned on.

Likewise, decoder DC12 is selected in switch control circuit 33. As a result, both the decoding signal outputted from decoder DC12 and that outputted from decoder DC13 become H level. Switch circuits SW26 to SW29 are, therefore, turned on.

At this moment, write potential supply circuit 44 which receives H-level write signal WRITE performs an operation in supply circuit SU10. In addition, read potential supply circuit 45 receives L-level read signal READ and, therefore, stops its operation.

Write potential supply circuit 44 receives address signals AC1 to AC3, supplies write potential VCCW to potential supply lines HBL23 and HBL24 and supplies ground potential GND to potential supply lines HBL21 and HBL22. Write potential supply circuit 44 supplies a floating current to potential supply lines HBL25 and HBL26. As a result, the potentials of bit lines BL2 and BL3 are kept to be write potential VCCW and those of bit liens BL4 and BL5 are kept to be ground potential GND.

Consequently, by selecting word line WL1, H-level data is stored in storage region L1 in memory cell MC10. In addition, no current is carried to the memory cells adjacent memory cell MC10 since no potential difference is generated between the both ends of each memory cell.

Likewise, the supply circuit, not shown, supplies ground potential GND to potential supply lines HBL31 and HBL32, and write potential VCCW to potential supply lines HBL33 and HBL34. Other potential supply lines HBL35 and HBL36 are in a floating state. As a result, the potentials of bit lines BL6 and BL7 are kept to be ground potential GND and the potentials of bit lines BL8 and BL9 are kept to be write potential VCCW. Therefore, H-level data is stored in storage region L2 of memory cell MC20 in memory cell array block MA1. At this moment, no current is carried to memory cells adjacent memory cell MC20.

As for the read operation, switch control circuits 32 and 33 perform the same operations as those during the write operation.

Through the above-mentioned operations, it is possible to conduct write and read operations to the memory cells in the different memory cell array blocks even if six potential power supply lines are arranged.

The semiconductor memory device having the above-mentioned configuration enables parallel access to a plurality of memory cells and have improved throughput for the write operation and the read operation.

Moreover, as for the bit lines adjacent the bit line connected to the selected memory cell, by keeping the potentials of the adjacent bit lines equal to those of the bit lines connected to the memory cell, it is possible to greatly decrease unnecessary charge and discharge currents even on the selected bit line. It is thereby possible to shorten time required for the write operation and the read operation.

In addition, setting the potential supply line outside of memory cell array enables to decrease the area of memory cell array.

Second Embodiment

In the first embodiment, the configuration of the nonvolatile semiconductor memory device if a plurality of potential supply lines connected to the supply circuit are arranged in parallel to the word lines has been described. Similarly, by arranging the potential supply lines in parallel to the bit lines, it is possible to conduct a write operation and a read operation to a selected memory cell.

Figure 7:
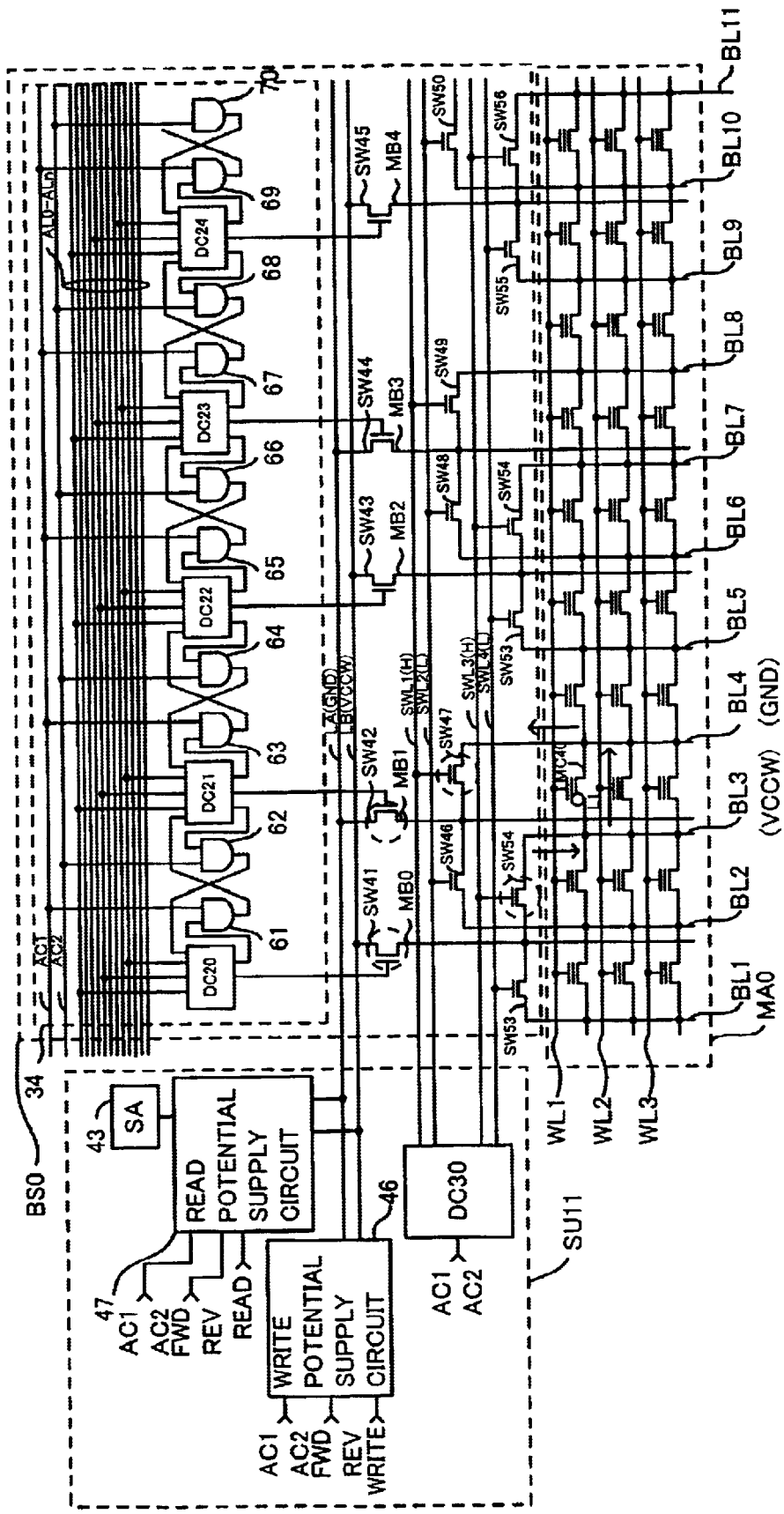
FIG. 7 is a circuit diagram showing the configuration of a potential control circuit in the second embodiment of the present invention.

FIG. 7 is a circuit diagram showing the configuration of a potential control circuit in the second embodiment of the present invention.

Referring to FIG. 7, memory cell array block MA0 includes a plurality of bit lines BL1 to BL11. The connection relationship between the bit lines and the word lines is the same as that of memory cell array block MA0 or MA1 shown in FIG. 4.

Bit line select circuit BS0 includes a switch control circuit 34 and a plurality of switch circuits SW41 to SW56.

A supply circuit SU1 includes a write potential supply circuit 46, a read potential supply circuit 47, sense amplifier 43 and a decoder DC30.

Write potential supply circuit 46 receives address signals AC1 and AC2, forward signal FWD, reverse signal REV and write signal WRITE, and supplies predetermined potentials to potential supply lines LA and LB, respectively. Read potential supply circuit 47 receives address signals AC1 and AC2, forward signal FWD, reverse signal REV and read signal READ, and supplies predetermined potentials to potential supply lines LA and LB during a read operation, respectively.

Switch control circuit 34 includes a plurality of decoders DC20 to DC24 and a plurality of logic gates 61 to 70.

Decoder DC20 receives a predetermined internal address signal among the internal address signals transmitted on a plurality of internal address signal lines AL0 to ALn and the output signal of logic gate 62, and outputs a decoding signal to switch circuit SW41 and logic gate 61. Logic gate 61 receives the decoding signal outputted from decoder DC20 and address signal AC1, and outputs an AND logic operation result.

Decoder DC21 receives a predetermined internal address signal and the output signal of logic gate 61, and outputs a decoding signal to switch circuit SW42 and logic gate 62. Logic gate 62 receives the decoding signal outputted from decoder DC21 and address signal AC2, and outputs an AND logic operation result to decoder DC22.

Decoder DC22 receives a predetermined internal address signal, the output signal of logic gate 63 and the output signal of logic gate 66, and outputs a decoding signal to logic gates 64 and 65 and switch circuit SW43. Logic gate 64 receives the decoding signal outputted from decoder DC22 and address signal AC2, and outputs an AND logic operation result to decoder DC21. Logic gate 65 receives the decoding signal outputted from decoder DC22 and address signal AC1, and outputs an AND logic operation result to decoder DC23.

Decoder DC23 receives a predetermined internal address signal, the output signal of logic gate 65 and the output signal of logic gate 68, and outputs a decoding signal to logic gates 66 and 67 and switch circuit SW44. Decoder DC24 receives a predetermined address signal, the output signal of logic gate 67 and the output signal of logic gate 70, and outputs a decoding signal to logic gates 68 and 69 and switch circuit SW45.

With the above-mentioned configuration, if an arbitrary decoder among the plural decoders in switch control circuit 34 operates, two decoders adjacent the arbitrary decoder simultaneously operate. Specifically, if decoder DC21 is activated, decoders DC20 and DC22 adjacent decoder DC21 simultaneously operate.

Switch circuit SW41 is connected between a main bit line MB0 and potential supply line LB and the gate thereof receives the decoding signal outputted from decoder DC20. Switch circuit SW42 is connected between a main bit line MB1 and potential supply line LA and the gate thereof receives the decoding signal outputted from decoder DC21. Switch circuit SW43 is connected between a main bit line MB2 and potential supply line LB and the gate thereof receives the decoding signal outputted from decoder DC22. Switch circuit SW44 is connected between a main bit line MB3 and potential supply line LA and the gate thereof receives the decoding signal outputted from decoder DC23. Switch circuit SW45 is connected between a main bit line MB4 and potential supply line LB and the gate thereof receives the decoding signal outputted from decoder DC24.

It is noted that a plurality of main bit lines MB0 to MB4 are arranged in parallel to a plurality of bit lines BL1 to BL11 in memory cell array block MA0.

Decoder DC30 in supply circuit SU11 is connected to a plurality of switch select lines SWL1 to SWL4. Switch select lines SWL1 to SWL4 are arranged in parallel to potential supply lines LA and LB. Decoder DC30 receives address signals AC1 and AC2 and selects one of switch select lines SWL1 to SWL4.

Switch circuit SW46 is connected between bit line BL2 and main bit line MB1 and the gate thereof is connected to switch select line SWL2. Switch circuit SW47 is connected between main bit line MB1 and bit line BL4 and the gate thereof is connected to switch select line SWL1. Switch circuit SW48 is connected between bit line BL6 and main bit line MB3 and the gate thereof is connected to switch select line SWL2. Switch circuit SW49 is connected between main bit line MB3 and bit line BL8 and the gate thereof is connected to switch select line SWL1. Switch circuit SW50 is connected between bit line BL10 and a main bit line, not shown, adjacent main bit line MB4 and the gate thereof is connected to switch select line SWL2.

Switch circuit SW51 is connected between bit line BL1 and main bit line MB0 and the gate thereof is connected to switch select line SWL4. Switch circuit SW52 is connected between main bit line MB0 and bit line BL3 and the gate thereof is connected to switch select line SWL3. Switch circuit SW53 is connected between bit line BL5 and main bit line MB2 and the gate thereof is connected to switch select line SWL4. Switch circuit SW54 is connected between main bit line MB2 and bit line BL7 and the gate thereof is connected to switch select line SWL3. Switch circuit SW55 is connected between bit line BL9 and main bit line MB4 and the gate thereof is connected to switch select line SWL4. Switch circuit SW56 is connected between main bit line MB4 and bit line BL1 and the gate thereof is connected to switch select line SWL3.

The operation of the potential control circuit having the above-mentioned circuit configuration will be described.

The operation of the potential control circuit if data is written to storage region L1 of memory cell MC40 in memory cell array block MA0 shown in FIG. 7 will be described.

During this operation, read signal READ becomes L level and write signal WRITE becomes H level. As a result, read potential supply circuit 47 stops its operation and write potential supply circuit 46 supplies potentials to potential supply lines LA and LB, respectively. If H-level data is written to storage region L1 of memory cell MC40, write potential supply circuit 46 supplies ground potential GND to potential supply line LA and write potential VCCW to potential supply line LB. In addition, decoder DC30 selects switch select lines SWL1 and SWL3.

At this moment, decoder DC21 in switch control circuit 34 is selected. As a result, decoder DC21, and decoders DC20 and DC22 adjacent decoder DC21 output decoding signals, respectively. Consequently, switch circuits SW41, SW42 and SW43 are turned on. Through the above-mentioned operations, write potential VCCW is supplied to main bit lines MB0 and MB2 and ground potential GND is supplied to main bit line MB1.

On the other hand, since decoder DC30 selects switch select lines SWL1 and SWL3, switch circuits SW47 and SW49 connected to switch select line SWL1 and switch circuits SW52, SW54 and SW56 connected to switch select line SWL3 are turned on. As a result, the potential of bit line BL3 connected to memory cell MC40 is kept to have the potential level of write potential VCCW and that of bit line BL4 is kept to be ground potential GND. Through the above-mentioned operations, H-level data can be written to storage region L1 of memory cell MC40. Through similar operations, it is possible to conduct a write operation and a read operation to a specific memory cell.

Through the above-mentioned operations, main bit line MB in the semiconductor memory device in the second embodiment functions in the same manner as potential supply line HBL in the semiconductor memory device in the first embodiment. As a result, it is possible to not only arrange the potential supply lines in parallel to the word lines but also arrange the potential supply lines in parallel to the bit lines.

Consequently, it is possible to consider the arrangement of the potential supply lines according to the allowable range of a memory cell array area.

Third Embodiment

Figure 8:
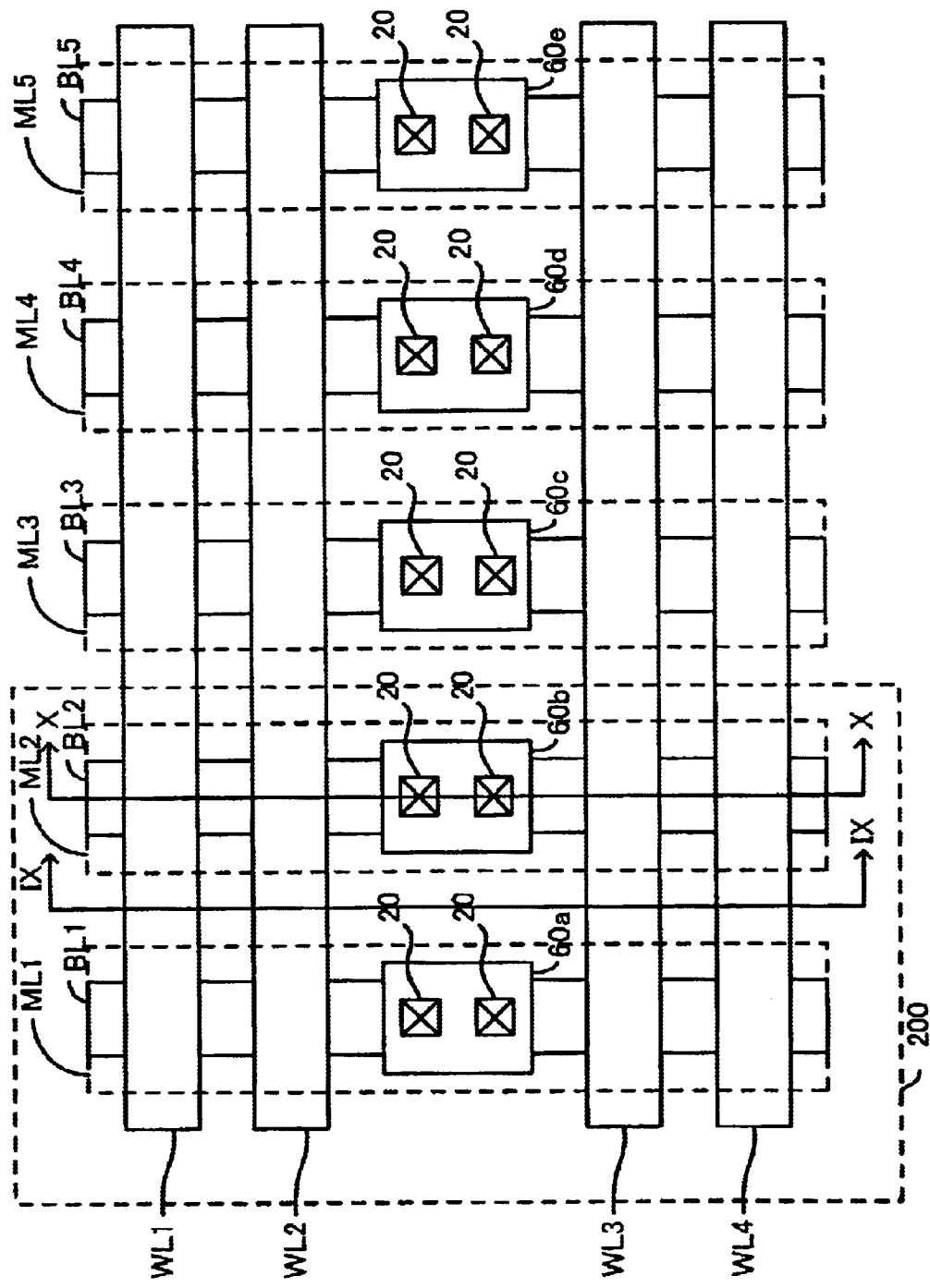
FIG. 8 is a plan view showing the configuration of a memory cell array 12 shown in the first embodiment.

FIG. 8 is a plan view showing the configuration of memory cell array 12 shown in the first embodiment.

Referring to FIG. 8, a plurality of word lines WL1 to WL4 are arranged in the row direction and a plurality of bit lines BL1 to BL5 are arranged in the column directions. It is noted that bit lines BL1 to BL5 are diffused bit lines formed as conductive layers on a semiconductor substrate. Word lines WL1 to WL4 are formed on diffused bit lines BL1 to BL5.

Pile driving sections 60a to 60e are formed between word lines WL2 and WL3 on diffused bit lines BL1 to BL5, respectively. Each of pile driving sections 60a to 60e is formed out of a conductive layer and a plurality of contact sections 20 are formed in each pile driving section.

Metal lines ML1 to ML5 are formed on word lines WL1 to WL4 in respective regions located on diffused bit lines BL1 to BL5.

Figure 9:
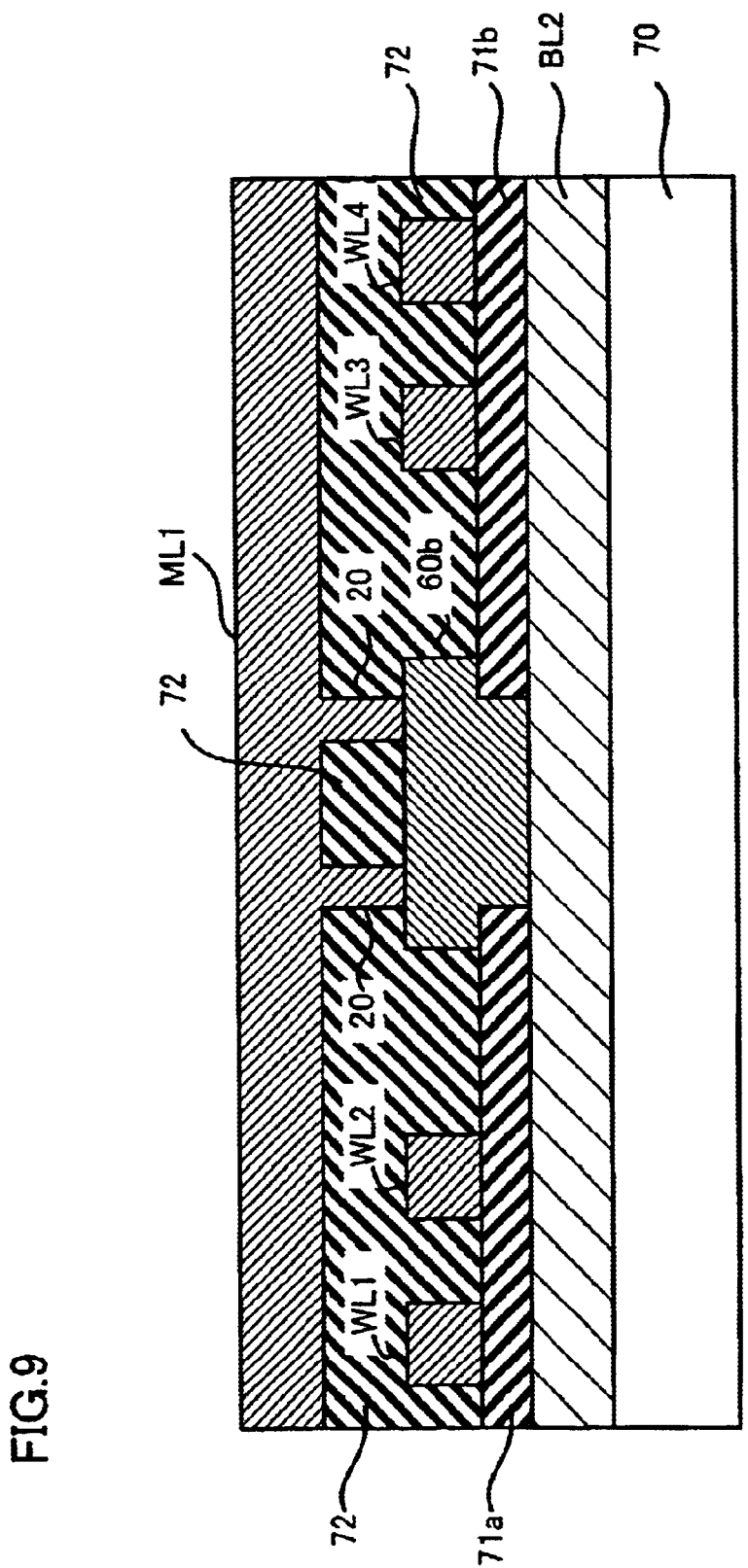
FIG. 9 is a cross-sectional typical view taken along line IX—IX of FIG. 8.

FIG. 9 is a cross-sectional typical view taken along line IX—IX of FIG. 8.

Referring to FIG. 9, diffused bit line BL1 is formed on the main surface of a semiconductor substrate 70. Interlayer insulating films 71a and 71b are formed on diffused bit line BL1 at predetermined intervals. A conductive layer 60a is formed on diffused bit line BL1 between interlayer insulating films 71a and 71b. In addition, word lines WL1 and WL2 are formed on interlayer insulating film 71a at predetermined intervals, and word lines WL3 and WL4 are formed on interlayer insulating film 71b at predetermined intervals. An interlayer insulating film 72 is formed on word lines WL1 to WL4, conductive layer 60a and interlayer insulating films 71a and 71b. Metal line ML1 is formed on interlayer insulating film 72. Metal line ML1 is extended to the bottoms of contact sections 20 and connected to conductive layer 60a.

Figure 10:
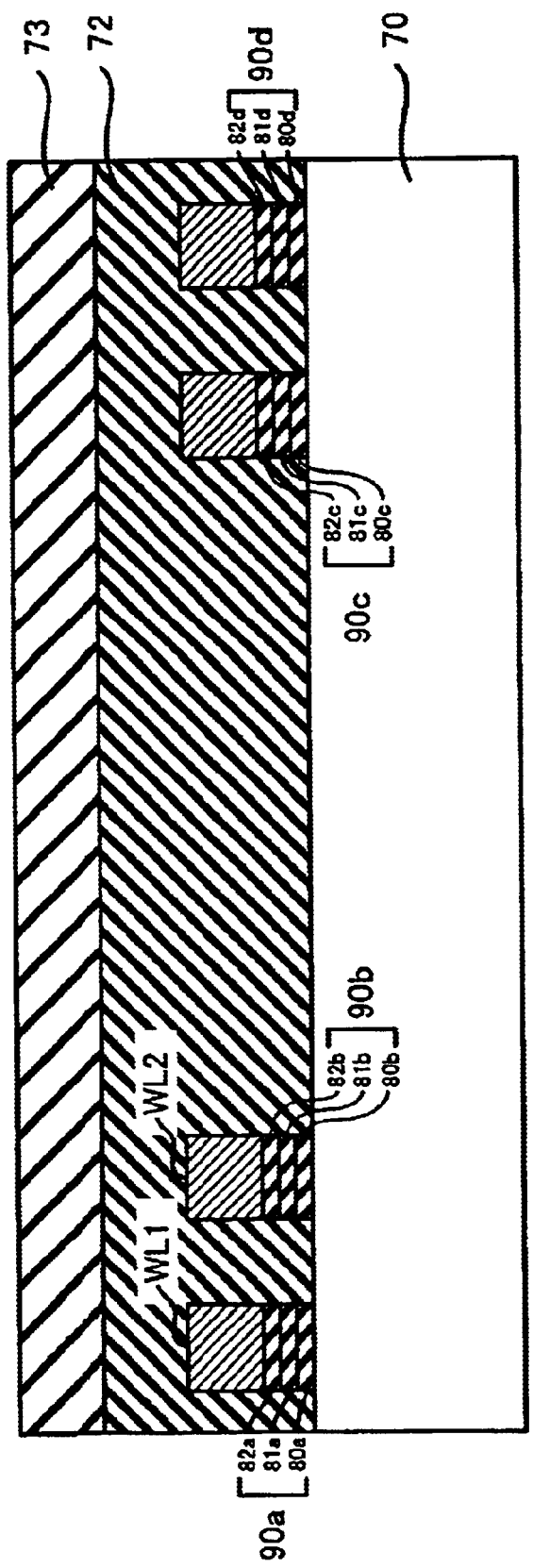
FIG. 10 is a cross-sectional typical view taken along line X—X of FIG. 8.

FIG. 10 is a cross-sectional typical view taken along line X—X of FIG. 8.

Referring to FIG. 10, silicon oxide films 80a to 80d are formed on the main surface of semiconductor substrate 70 at predetermined intervals. Nitride films 81a to 81d for accumulating charges are formed on silicon oxide films 80a to 80d, respectively. Each of nitride films 81a to 81d includes two storage regions. As a result, data of 2 bits can be stored in one memory cell.

The multilayer structures of silicon oxide films 80a to 80d, nitride films 81a to 81d and silicon oxide films 82a to 82d are referred to as "ONO films (Oxide-Nitride-Oxide films)", respectively. Silicon film 80a, nitride film 81a and silicon oxide film 82a will be referred to as an "ONO film 90a" hereinafter. Silicon film 80b, nitride film 81b and silicon oxide film 82b will be referred to as an "ONO film 90b" hereinafter. Likewise, silicon film 80c, nitride film 81c and silicon oxide film 82c will be referred to as an "ONO film 90c" hereinafter. Silicon film 80d, nitride film 81d and silicon oxide film 82d will be referred to as an "ONO film 90d" hereinafter.

Word lines WL1 to WL4 are formed on silicon oxide films 82a to 82d, respectively. Interlayer insulating film 72 is formed on word lines WL1 to WL4 on semiconductor substrate 70 in regions in which silicon oxide films 80a to 80d are not formed. An interlayer insulating film 73 is formed on interlayer insulating film 72.

The manufacturing steps of the nonvolatile semiconductor memory device having the above-mentioned structure will be described.

FIGS. 11A to 17C are plan views or cross-sectional views for explaining the manufacturing steps of the nonvolatile semiconductor memory device in the third embodiment of the present invention. It is noted that FIGS. 11A to 17A are plan views of the inside of a region 200 shown in FIG. 8 and that FIGS. 11B to 17B are cross-sectional views taken along line IX—IX in region 200 shown in FIG. 8. In addition, FIGS. 11C to 17C are cross-sectional views taken along line X—X in region 200 shown in FIG. 8.

Figure 11A:
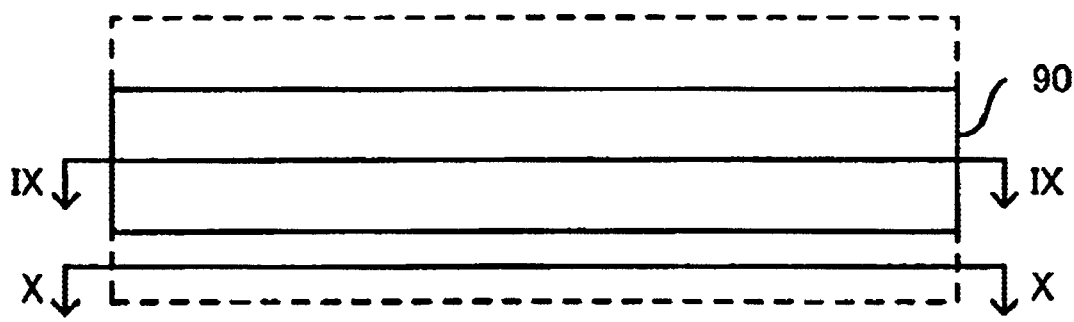
FIGS. 11A to 17C are plan views or cross-sectional views for explaining the first to seventh steps of manufacturing a semiconductor memory device in the third embodiment of the present invention.
Figure 11B:
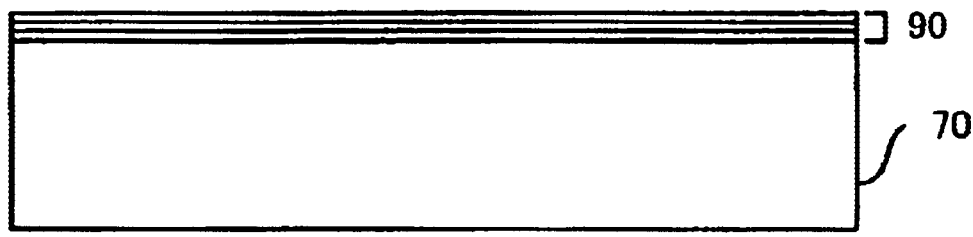
Figure 11C:
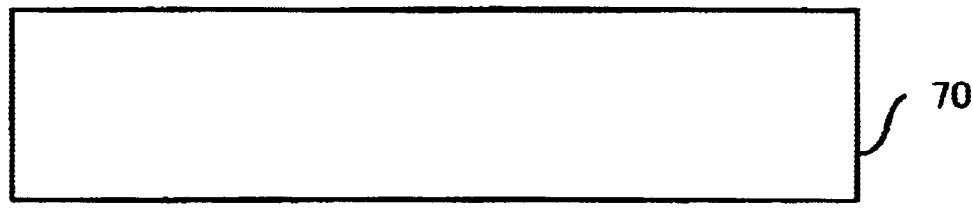

Referring to FIGS. 11A to 11C, ONO films 90 each of which consists of a silicon oxide film 80, a nitride film 81 and a silicon oxide film 82, are first formed on semiconductor substrate 70 at predetermined intervals.

As shown in FIG. 11B, silicon oxide film 80 is formed on the main surface of semiconductor substrate 70 by a thermal oxidization method. Next, nitride film 81 is formed on silicon oxide film 80. Nitride film 81 is formed by a low pressure CVD method. Thereafter, silicon oxide film 82 is formed on nitride film 81. Through the above-mentioned steps, ONO film 90 consisting of silicon oxide film 80, nitride film 81 and silicon oxide film 82, is formed on the semiconductor substrate.

After the formation of ONO film 90, etching is performed using a resist film, whereby ONO film 90 is left at predetermined intervals as shown in FIG. 11A. As a result, in the X—X cross section in which the ONO film is removed, nothing is formed on semiconductor substrate 70 as shown in FIG. 11C.

Figure 12A:
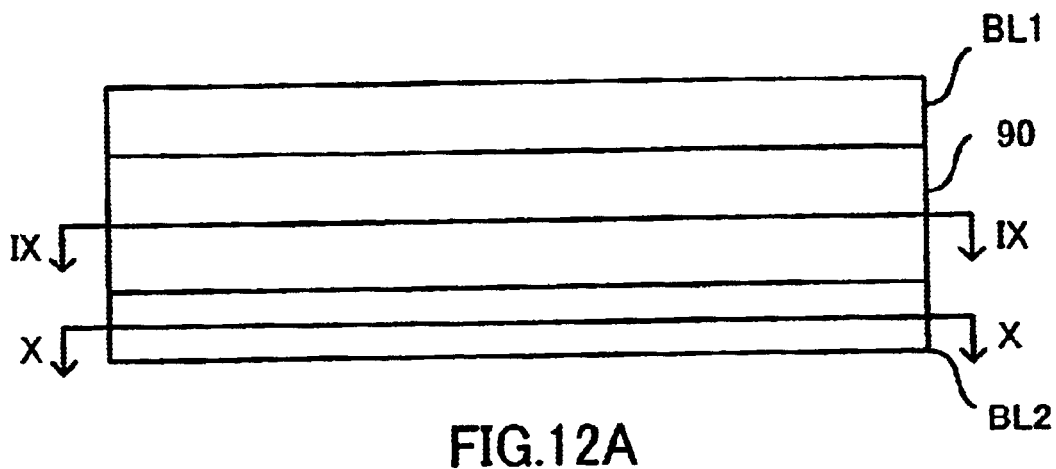
Figure 12B:
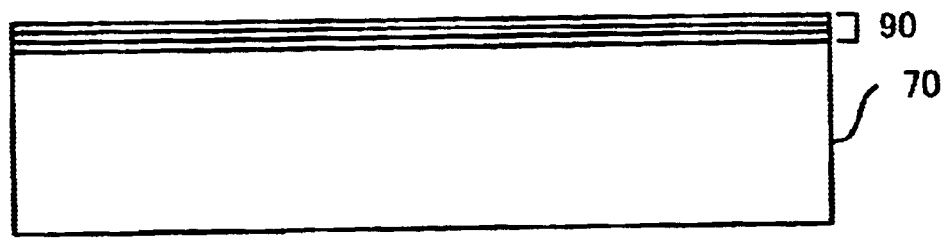
Figure 12C:
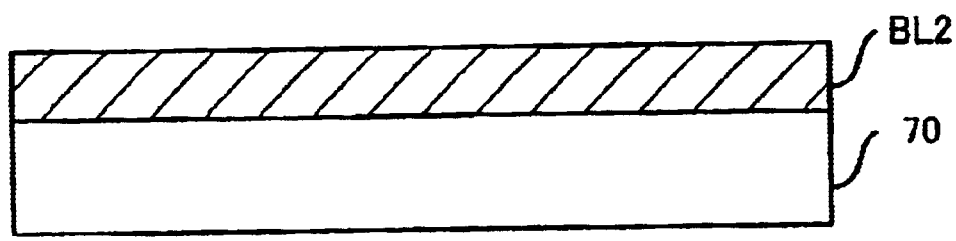

Next, as shown in FIGS. 12A to 12C, arsenic ions are injected into the regions, in which the ONO films are not formed, on semiconductor substrate 70. Thereafter, semiconductor substrate 70 is held in a nitrogen atmosphere at a predetermined temperature, whereby a heat treatment is conducted to substrate 70. As a result of this heat treatment, the arsenic ions are activated and diffused bit line WL1 which is a conductive layer is formed on the main surface of semiconductor substrate 70 in the X—X cross section as shown in FIG. 12C. At this moment, in the IX—IX cross section in which the ONO films are formed on semiconductor substrate 70, the diffused bit line is not formed.

Figure 13A:
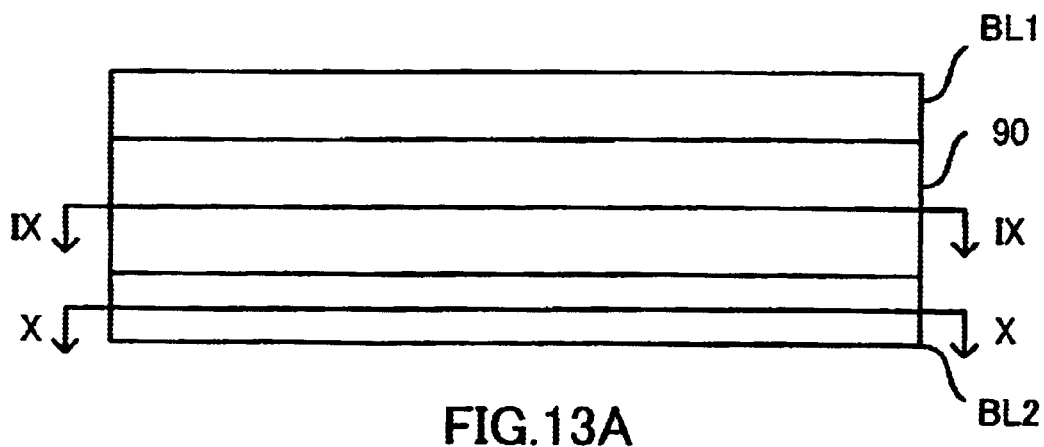
Figure 13B:
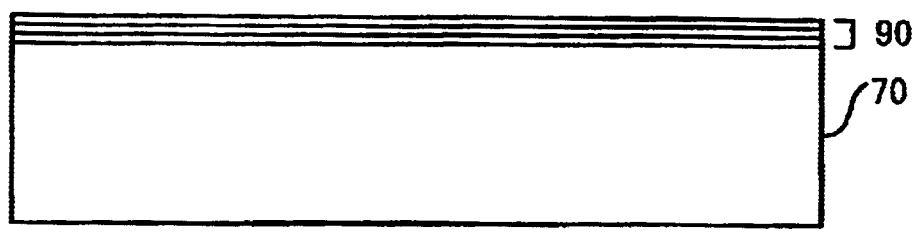
Figure 13C:
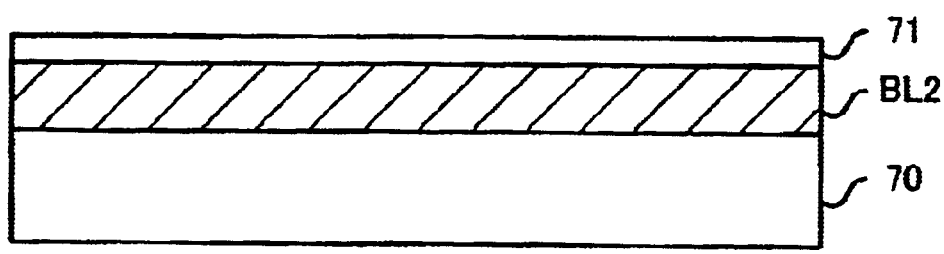

Next, interlayer insulating film 71 is formed on the diffused bit line formed on the main surface of semiconductor substrate 70 as shown in FIGS. 13A to 13C. Interlayer insulating film 71 is formed by a CVD method and a heat treatment is then conducted to semiconductor substrate 70, thereby hardening interlayer insulating film 71. As shown in FIG. 13B, interlayer insulating film 71 is not formed in the IX—IX cross section.

Figure 14A:
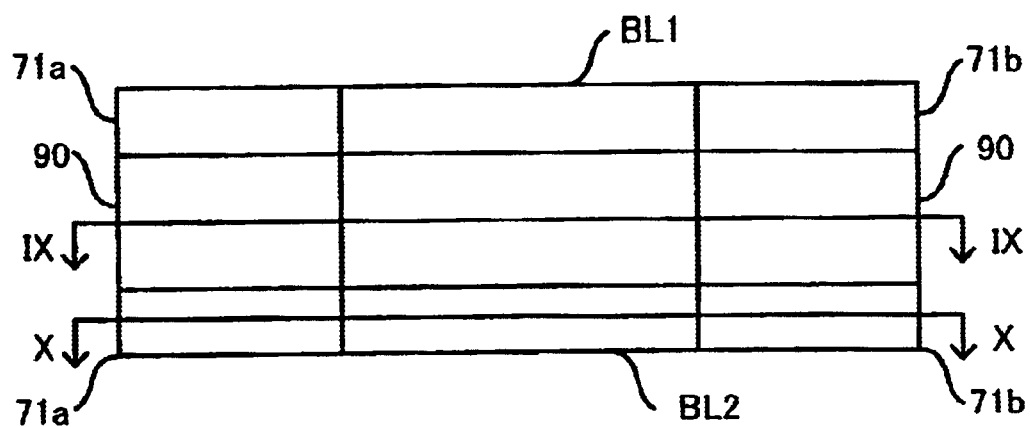
Figure 14B:
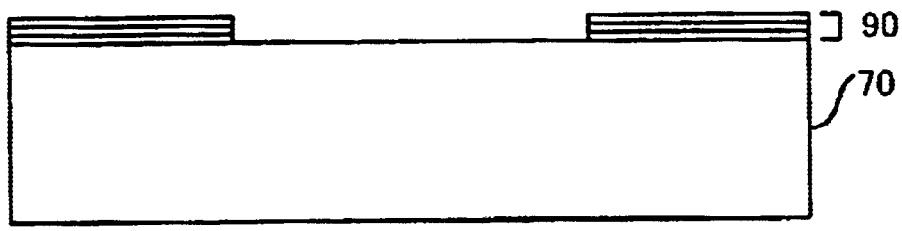
Figure 14C:
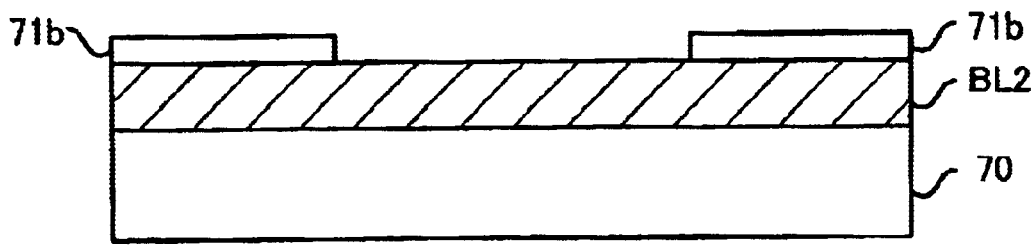

Next, as shown in FIGS. 14A to 14C, ONO films and interlayer insulating film 71 are removed by as much as predetermined regions by etching using a resist film so as to secure regions for forming contact sections 60. The plan view of region 200 after ONO films and interlayer insulating film 71 are removed, and the cross sectional view taken along line IX—IX is shown in FIG. 14B and the cross-sectional view taken along line X—X is shown in FIG. 14C.

Figure 15A:
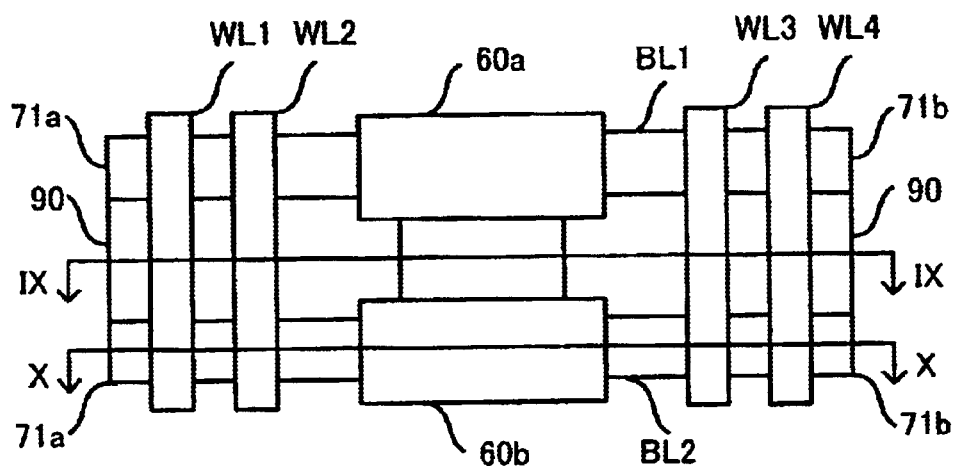
Figure 15B:
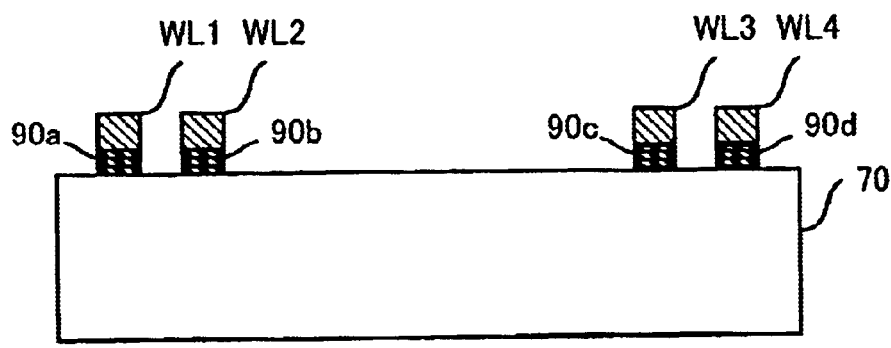
Figure 15C:
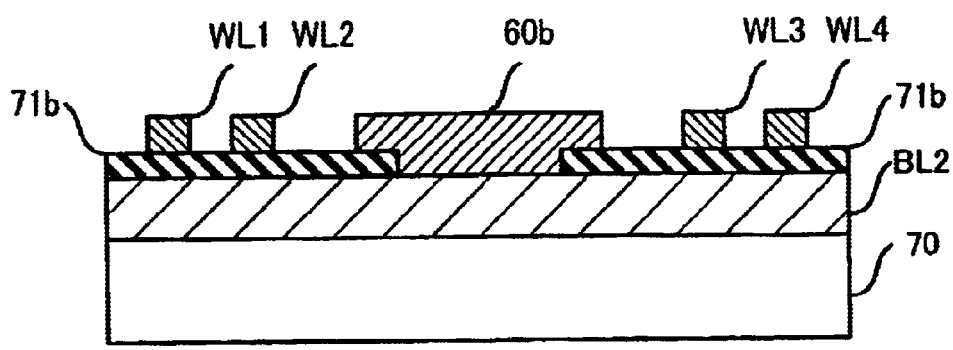

Next, as shown in FIGS. 15A to 15C, word lines WL1 to WL4 are formed at predetermined intervals. At this time, a contact section 60a is formed on the diffused bit line by the same method as the word line formation method. Word lines WL1 to WL4 and conductive layer 60a are made of, for example, polysilicon and formed by the low pressure CVD method.

It is noted that the ONO films in sections on which no word lines are formed are automatically removed simultaneously with the formation of word lines WL1 to WL4.

Figure 16A:
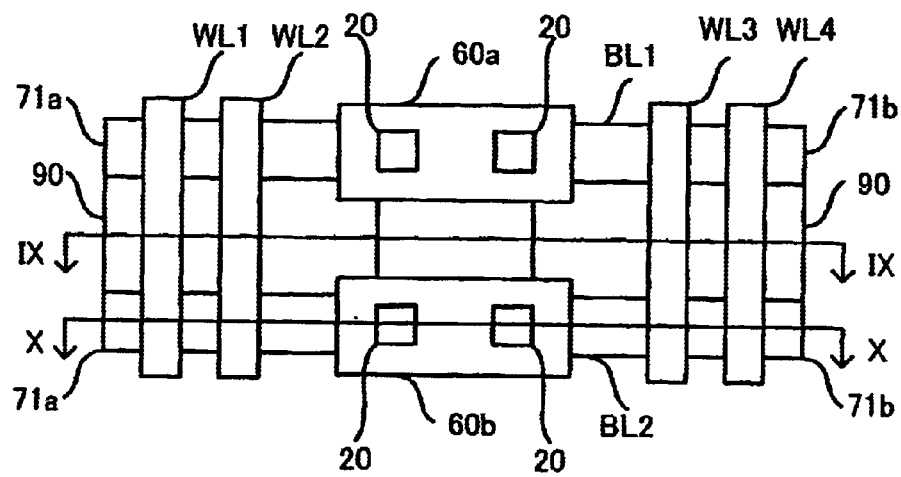
Figure 16B:
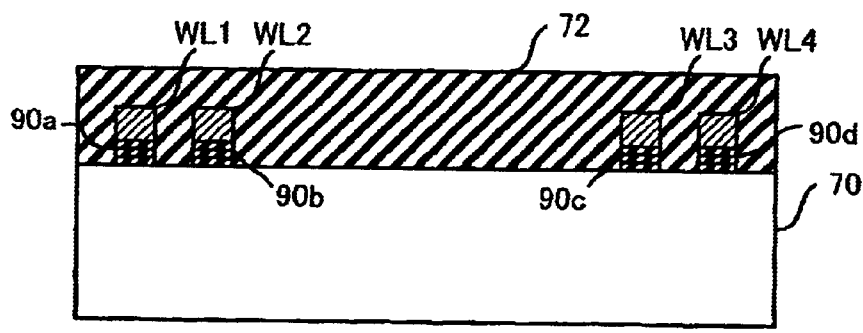
Figure 16C:
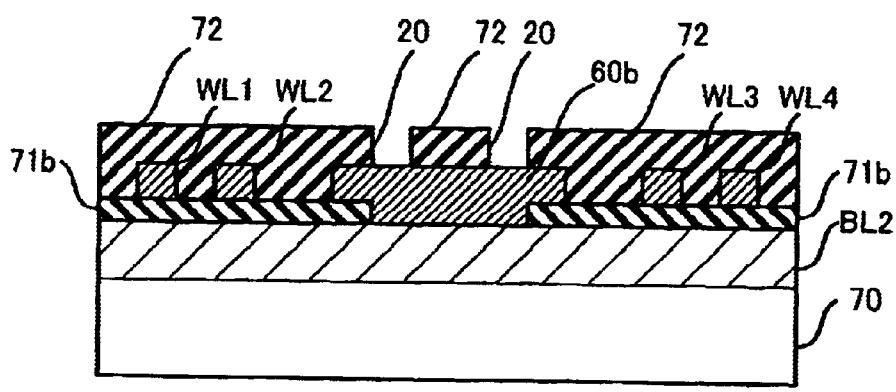

Next, as shown in FIGS. 16A to 16C, interlayer insulating film 72 is formed on a plurality of word lines WL1 to WL4, on the main surface of semiconductor substrate 70 and on interlayer insulating film 71. Interlayer insulating film 72 is formed by the CVD method. Thereafter, a heat treatment is conducted to semiconductor substrate 70, thereby hardening interlayer insulating film 72. A resist film, not shown, is formed on interlayer insulating film 72 by a lithographic method. Using this resist film as a mask, interlayer insulating film 72 is etched, whereby interlayer insulating film 72 in the X—X cross-section is partially removed and contact sections 20 are formed as shown in FIG. 16C. On the other hand, as shown in FIG. 16B, interlayer insulating film 72 is not etched in the IX—IX cross section. The resist film is then removed.

Figure 17A:
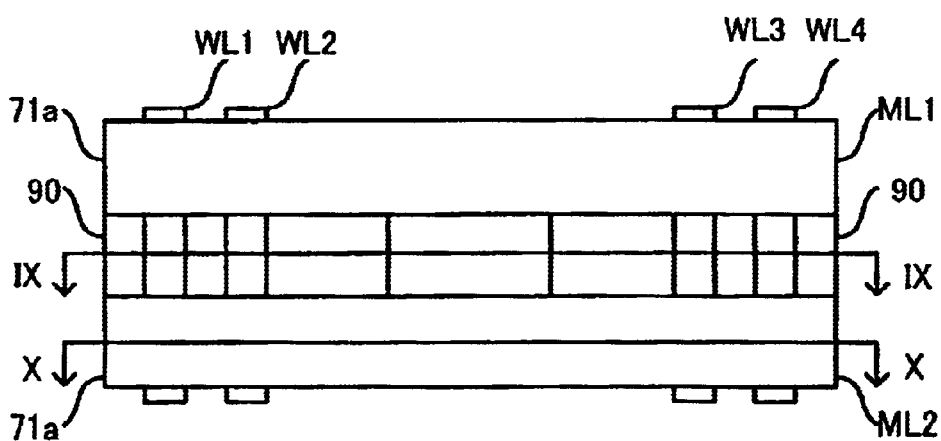
Figure 17B:
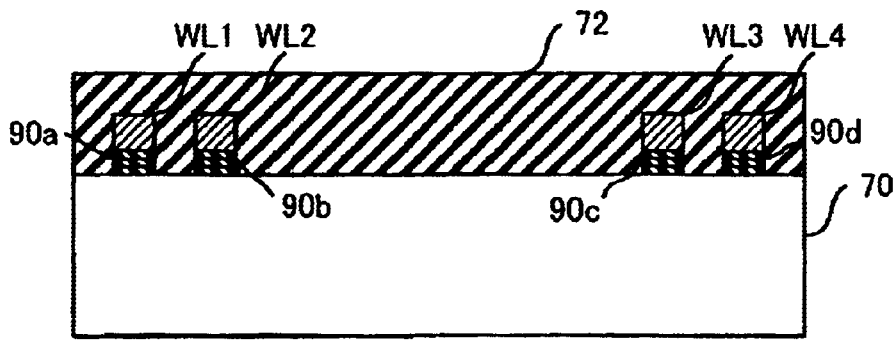
Figure 17C:
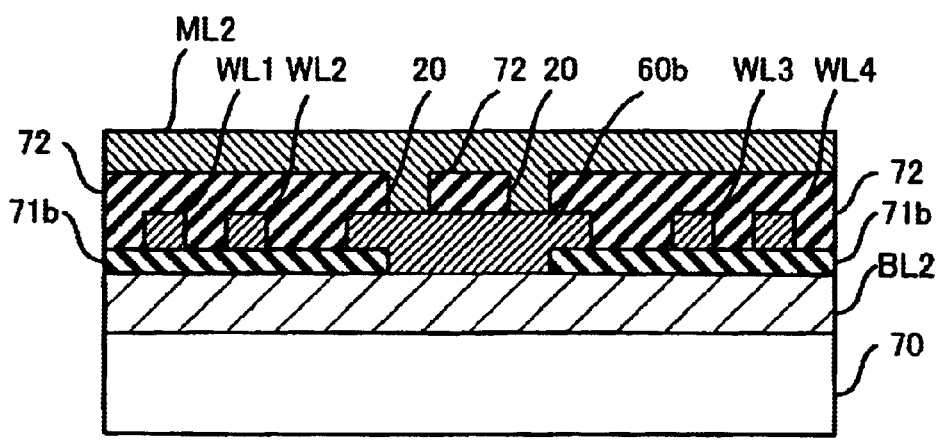

Next, as shown in FIGS. 17A to 17C, metal line ML is formed by a sputtering method so as to be extended from the inside of contact sections 20 onto the upper surface of interlayer insulating film 72. Metal line ML is, for example, an aluminum-silicon-copper (Al—Si—Cu) alloy film. A resist film (not shown) having a wiring pattern is formed on this alloy film by a photolithographic method. Using this resist film as a mask, the alloy film is partially etched away, thereby forming metal lines ML1 to ML5 arranged in the column direction. As a result, the structure shown in the IX—IX cross section of FIG. 17B and the X—X cross section of FIG. 17C can be obtained.

Through the above-mentioned manufacturing steps, pile driving sections can be formed in the memory cell array of the semiconductor memory device.

The formation of these pile driving sections have the following advantages.

That is, according to conventional semiconductor memory device manufacturing steps, it is impossible to secure the continuity of the shapes of a plurality of word lines. According to the present invention, by contrast, by inserting a pile driving section formed in the same steps as those of the word lines between predetermined word lines, it is possible to secure the continuity of the shapes of the word lines. It is, therefore, unnecessary to form a dummy word line or the like.

Furthermore, since the pile driving section is formed on the diffused bit line formed on the main surface of the semiconductor substrate, it is possible to decrease resistance.

Moreover, since the presence of the pile driving section enables shortening the length of each contact hole compared with that of the conventional contact hole, the probability of causing the poor opening of the contact holes in the manufacturing steps is greatly decreased and manufacturing irregularity is decreased. In addition, since the contact can be shortened and the resistance is decreased by the presence of the pile driving section, the contact can be made small in size and a layout margin increases, accordingly. Therefore, it is possible to form a plurality of contacts in the same region compared with the conventional method. Consequently, even if one of the contacts formed in the same region causes poor opening under some influence, it is possible to secure the opening by the other contacts. As a result, it is possible to improve yield.

Fourth Embodiment

Figure 18:
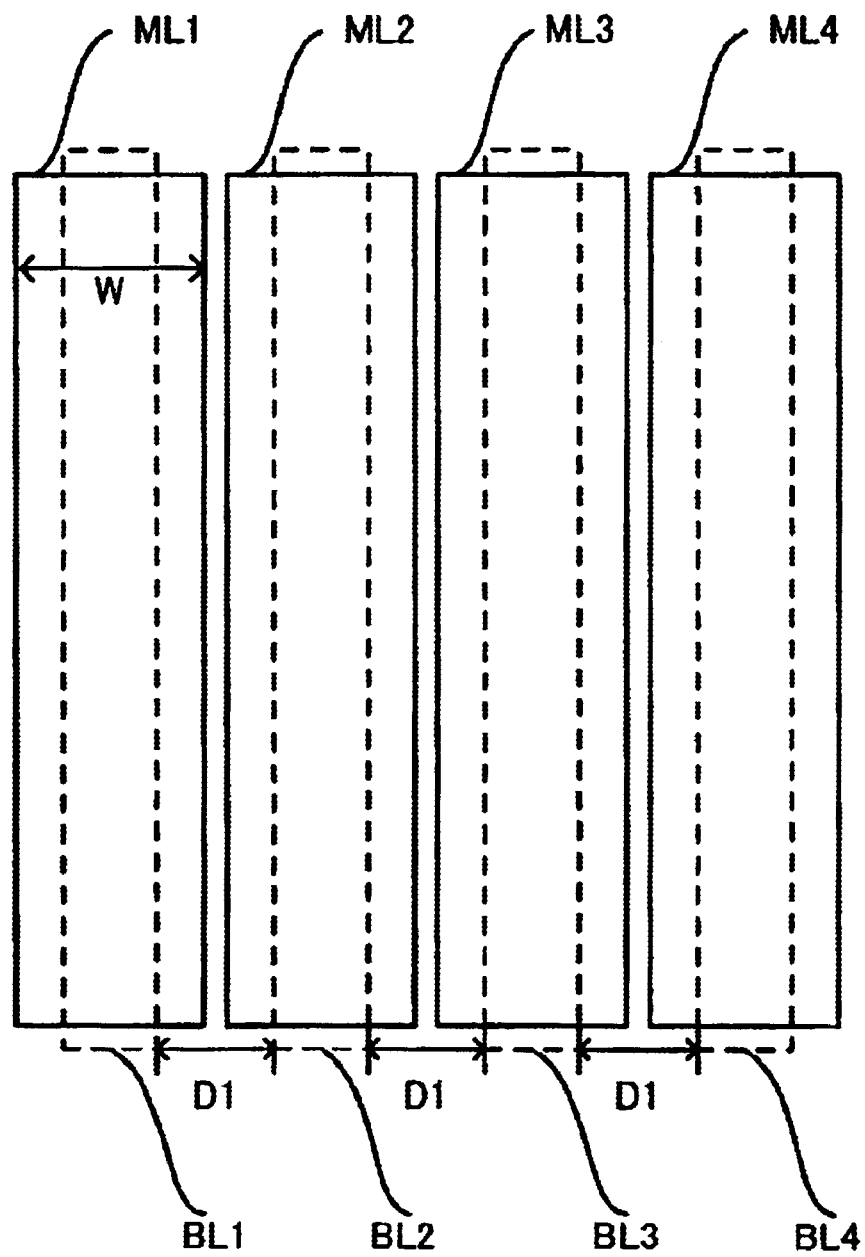
FIG. 18 is a plan view of a conventional semiconductor memory device.

FIG. 18 is a plan view of a conventional semiconductor memory device.

Referring to FIG. 18, the memory cell array of the semiconductor memory device is formed on the main surface of a semiconductor substrate and the memory cell array includes diffused bit lines BL1 to BL4 formed in the column direction at predetermined intervals. Metal lines ML1 to ML4 are arranged on the diffused bit lines to correspond to respective bit lines BL1 to BL4.

The width W of each of metal lines ML1 to ML4 shown in FIG. 8 cannot be narrowed to fall within a certain value due to the semiconductor memory device manufacturing process. Therefore, the distance between the diffused bit lines cannot be narrowed to fall within a predetermined value. It is assumed herein that the shortest distance between the conventional diffused bit lines is D1.

Nevertheless, it is preferable that the distance between the diffused bit lines is as short as possible following the progress of the recent micro-fabrication technology for semiconductor memory devices.

Figure 19:
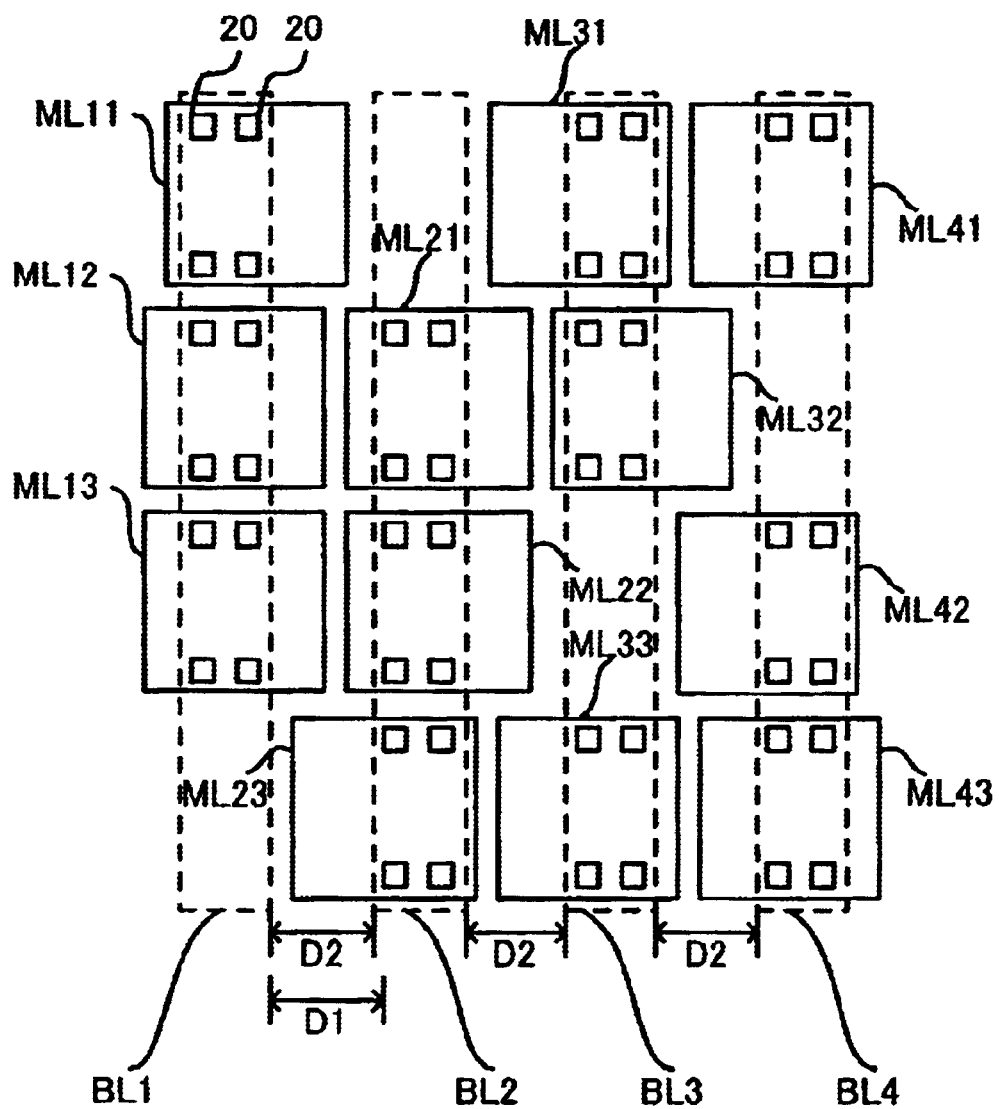
FIG. 19 is a plan view of a nonvolatile semiconductor memory device in the fourth embodiment of the present invention.

FIG. 19 is a plan view of a nonvolatile semiconductor memory device in the fourth embodiment of the present invention.

Referring to FIG. 19, in a memory cell array in the fourth embodiment, compared with that shown in FIG. 18, metal lines ML11 to ML13 instead of metal line ML1 are arranged on diffused bit line BL1. Metal lines ML21 to ML23 instead of metal line ML2 are arranged on diffused bit line BL2. Likewise, metal lines ML31 to ML33 instead of metal line ML3 are arranged on diffused bit line BL3. Metal lines ML41 to ML43 instead of metal line ML4 are arranged on diffused bit line BL4. Since the remaining configuration is equal to that shown in FIG. 18, it will not be repeatedly described herein.

The length of each of metal lines ML11 to ML13 is a quarter of the entire length of metal line ML1 shown in FIG. 18. Likewise, the length of each of metal lines ML21 to ML23 is a quarter of the entire length of metal line ML2. In addition, the length of each of metal lines ML31 to ML33 is a quarter of the entire length of metal line ML3. The length of each of metal lines ML41 to ML43 is a quarter of the entire length of metal line ML4.

Next, a method of arranging metal lines ML11 to ML13, ML21 to ML23, ML31 to ML33 and ML41 to ML43 will be described.

Metal lines ML11 to ML13 are arranged on diffused bit line BL1. As already described above, however, since the length of each of metal lines ML11 to ML13 is a quarter of that of metal line ML1, there exists a region in which no metal lines are arranged, on diffused bit line BL1 by a quarter of the entire length of diffused bit line BL1. Likewise, there exists a region in which no metal lines are arranged, on each of diffused bit lines BL2 to BL4 by a quarter of the entire length of each diffused bit line.

In other words, if the region on each diffused bit line is divided into four sub-regions, the metal lines exist in three out of the four sub-regions and the remaining one sub-region is a region in which no metal lines exist.

Now, attention is paid to a method of arranging metal lines ML11 and ML31.

No metal lines exist in a region put between metal lines ML11 and ML31 on diffused bit line BL2. If the extension direction of each metal line is assumed in parallel to the diffused bit lines, the center line of metal line ML11 relative to the extension direction thereof is arranged toward diffused bit line BL2 side rather than the center line of diffused bit line BL1 relative to the extension direction thereof.

Likewise, the center line of metal line ML31 relative to the extension direction thereof is arranged toward diffused bit line BL2 side rather than the center line of diffused bit line BL3 relative to the extension direction thereof.

That is, if a metal line is formed only on one of the two adjacent diffused bit lines, the center line of the metal line relative to the extension direction thereof is arranged toward the center line side on which the diffused bit line adjacent the diffused bit line connected to the metal line through the contact section is extended rather than the center line of the diffused bit line connected thereto in the extension direction of the diffused bit line.

Next, attention is paid to metal lines ML31 and ML41. In this case, no metal lines exist in the sub-region on diffused bit line BL2 corresponding to the sub-region on diffused bit line BL3 in which metal line ML31 is located.

As a result, as already described above, the center line of metal line ML31 relative to the extension direction thereof is arranged to be deviated from the center line of diffused bit line BL3 relative to the extension direction thereof to the center line side of diffused bit line BL2 relative to the extension direction thereof.

At this moment, metal line ML41 adjacent metal line ML31 is also arranged to deviate the center line of metal line ML41 relative to the extension direction thereof from the center line of diffused bit line BL4 relative to the extension direction thereof to the center line side of diffused bit line BL3 relative to the extension direction thereof.

In other words, if corresponding metal lines are formed on two adjacent diffused bit lines, respectively, the center line of the metal line on one of the diffused bit lines relative to the extension direction thereof is arranged to be deviated from the center line of the diffused bit line connected to the metal line through the contact section relative to the extension direction thereof to the center line side of the other diffused bit line.

By the above-mentioned arrangement method, it is possible to make the distance D2 between the bit lines shorter than distance D1.

Furthermore, since the distance of a current carried to the diffused bit line without flowing to the metal line can be suppressed to a quarter of the entire length of the diffused bit line, it is possible to maintain low resistance.

Figure 20:
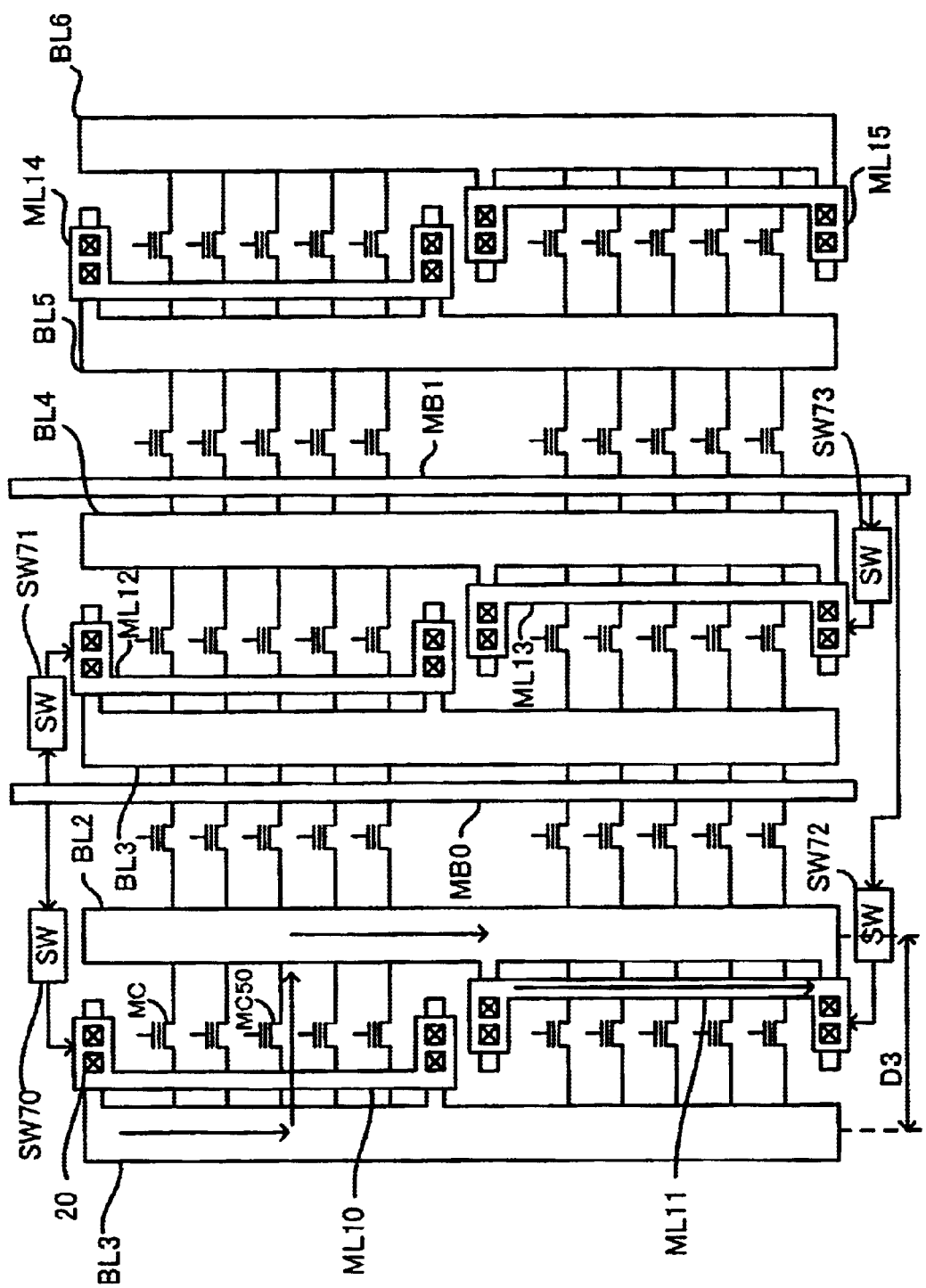
FIG. 20 is a plan view showing one example of the semiconductor memory device having the configuration shown in FIG. 7 if metal wirings are arranged.

FIG. 20 is a plan view showing one example of the semiconductor memory device having the configuration shown in FIG. 7 if metal lines are arranged.

Referring to FIG. 20, the memory cell array of the nonvolatile semiconductor memory device includes diffused bit lines BL1 to BL6, main bit lines MB0 and MB1, a plurality of memory cells and switch circuits SW70 to SW73.

Since the circuit configuration of this memory cell array is equal to that shown in FIG. 7, it will not be repeatedly described herein.

The memory cell array shown in FIG. 20 also includes metal lines ML10 to ML15. Metal line ML10 is formed on diffused bit line BL1 and the length of metal line ML10 is set to be half the length of diffused bit line BL1. Likewise, metal line ML11 is formed on diffused bit line BL2, metal line ML12 is formed on diffused bit line BL3, metal line ML13 is formed on diffused bit line BL4, metal line ML14 is formed on diffused bit line BL5, and metal line ML15 is formed on diffused bit line BL6. The length of each metal line is half the length of corresponding bit line. It is noted that main bit lines MB0 and MB1 are formed out of the same material as that of metal lines ML10 to ML15.

Next, a method of arranging metal lines ML10 to ML15 will be described.

A region located on each bit line is divided into two sub-regions. In this case, the metal line on one of the two adjacent diffused bit lines is arranged in a sub-region different from the sub-region corresponding to the sub-region in which the metal line on the other diffused bit line is arranged.

Specifically, no metal line is arranged in a sub-region on diffused bit line BL2 corresponding to the sub-region on diffused bit line BL1 in which metal line ML1 is arranged. Likewise, metal line ML11 is arranged in the sub-region on diffused bit line BL2 corresponding to the sub-region on diffused bit line BL1 in which no metal line is arranged.

With the above-mentioned configuration, it is possible to decrease the number of metal lines which are required to be arranged on the memory cell array. It is, therefore, possible to shorten the distance D3 between the diffused bit lines.

Figure 21:
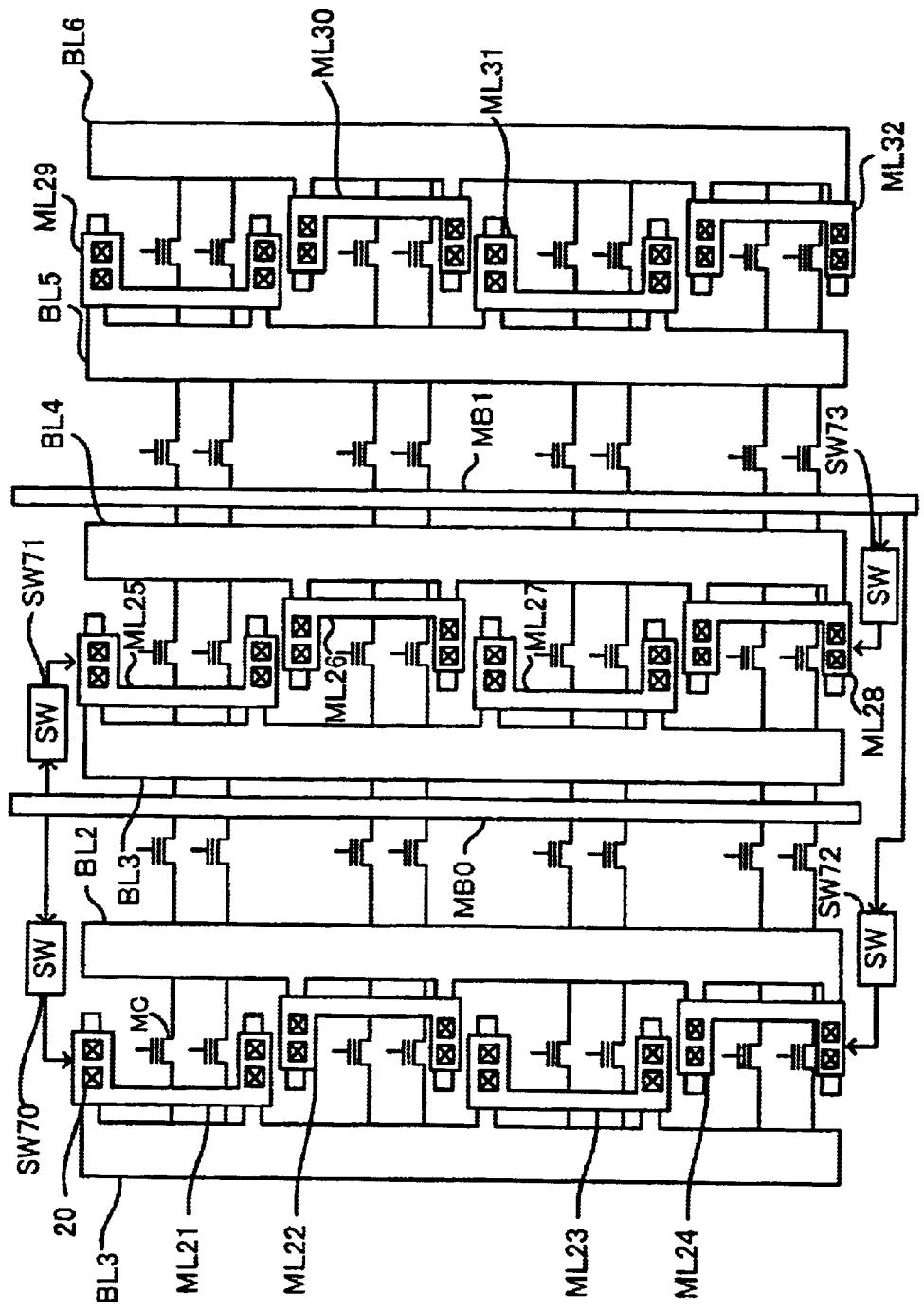
FIG. 21 is a plan view of the semiconductor memory device for showing a method of arranging metal wirings if a region on each diffused bit line is divided into four sub-regions.

FIG. 21 is a plan view of the semiconductor memory device for showing a method of arranging metal lines if a region on each diffused bit line is divided into four sub-regions.

The method of arranging metal lines shown in FIG. 21 is the same as that shown in FIG. 20. Namely, a region located on each bit line is divided into four sub-regions. In this case, a metal line on one of two adjacent diffused bit lines is arranged in a sub-region different from the sub-region corresponding to the sub-region on the other diffused bit line in which a metal line is arranged.

In this case, too, the longest current flow distance on each diffused bit line is half the entire length of each diffused bit line.

Figure 22:
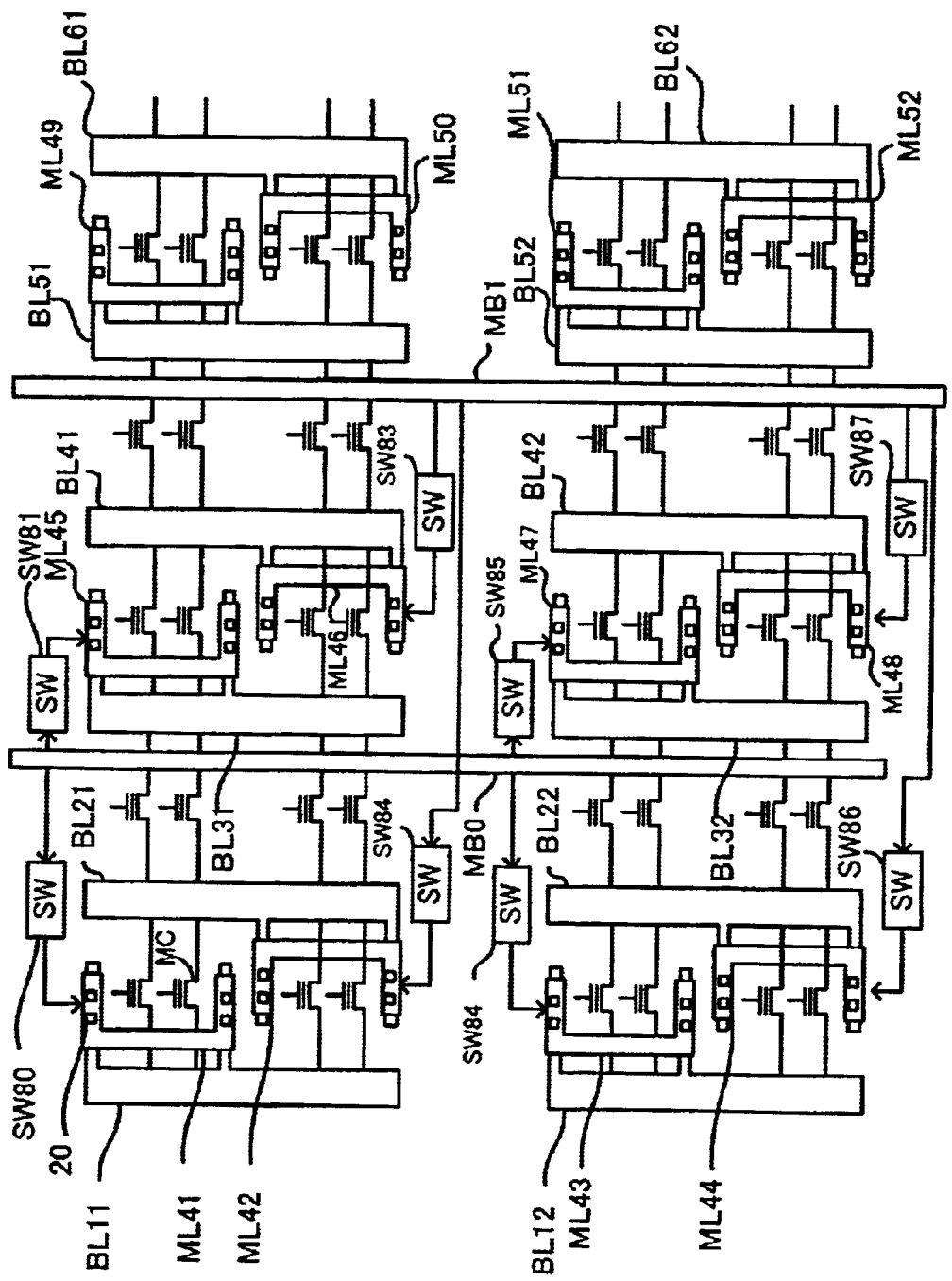
FIG. 22 is a plan view showing another example of the arrangement of metal wirings in the memory cell array of the semiconductor memory device.
Figure 23:
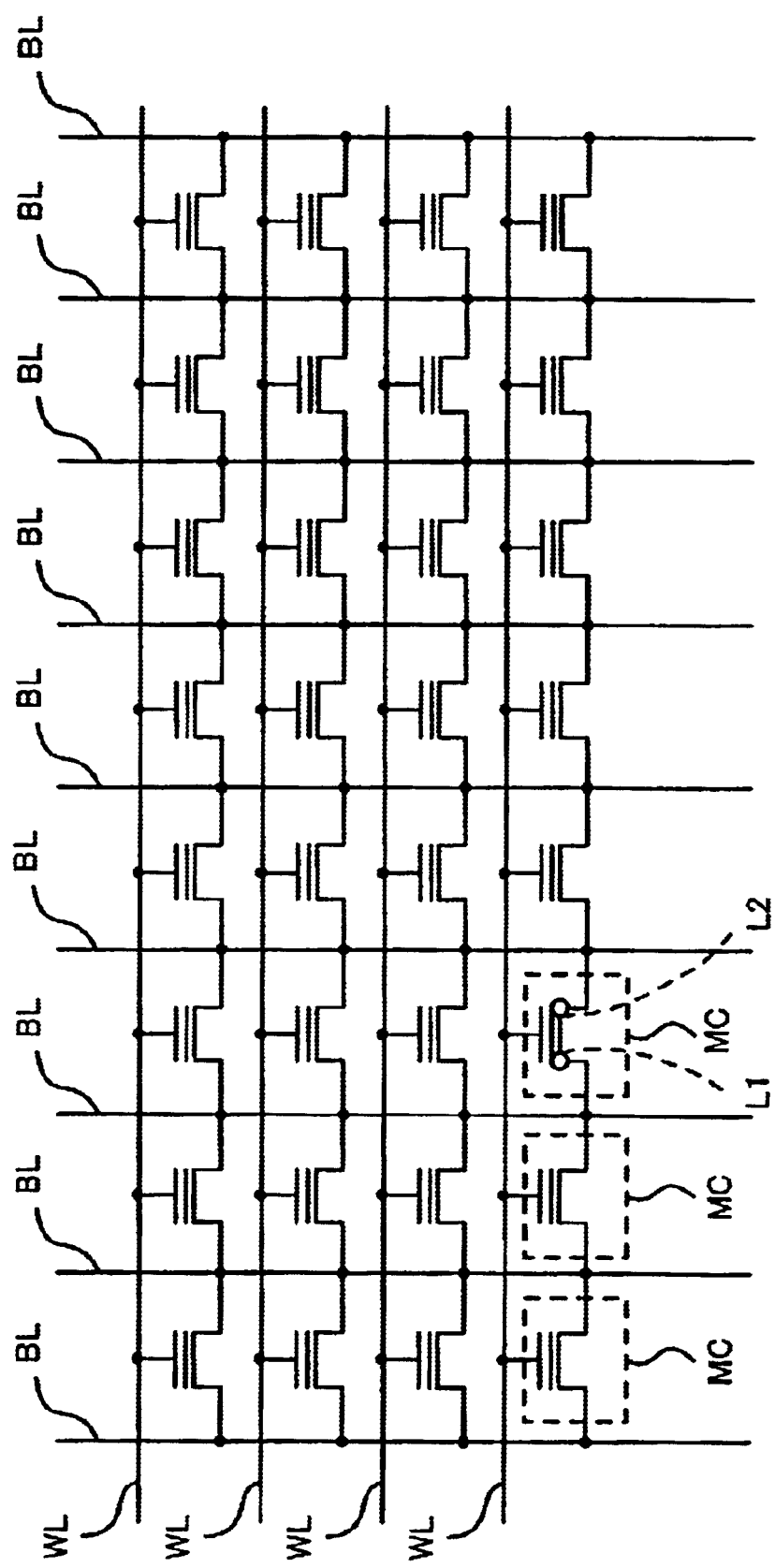
FIG. 23 is a circuit diagram showing the configuration of the memory cell array of a conventional semiconductor memory device.
Figure 24A:
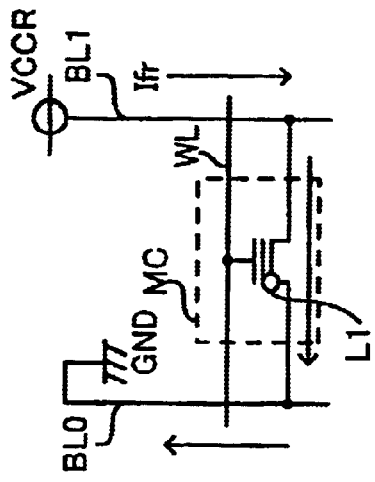
FIGS. 24A to 24D are views showing data write and read operations for writing and reading data to and from two storage regions in a nonvolatile memory cell.
Figure 24B:
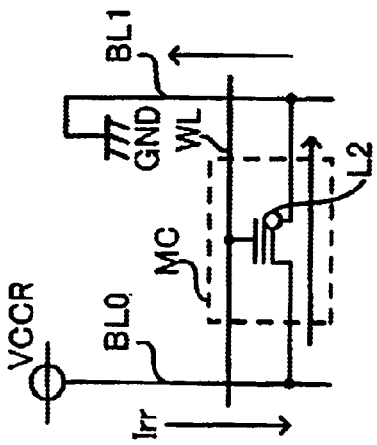
Figure 24C:
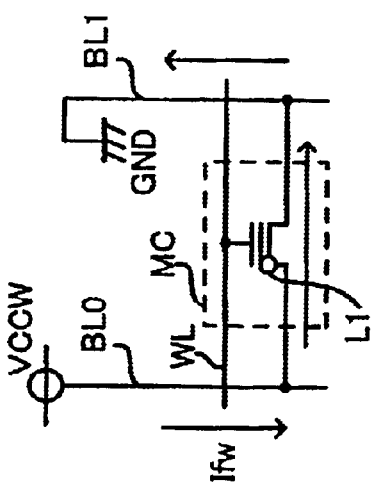
Figure 24D:
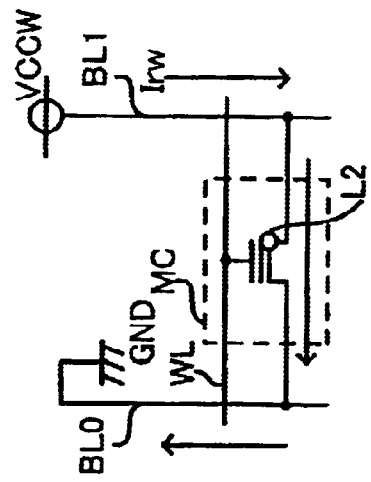
Figure 25:
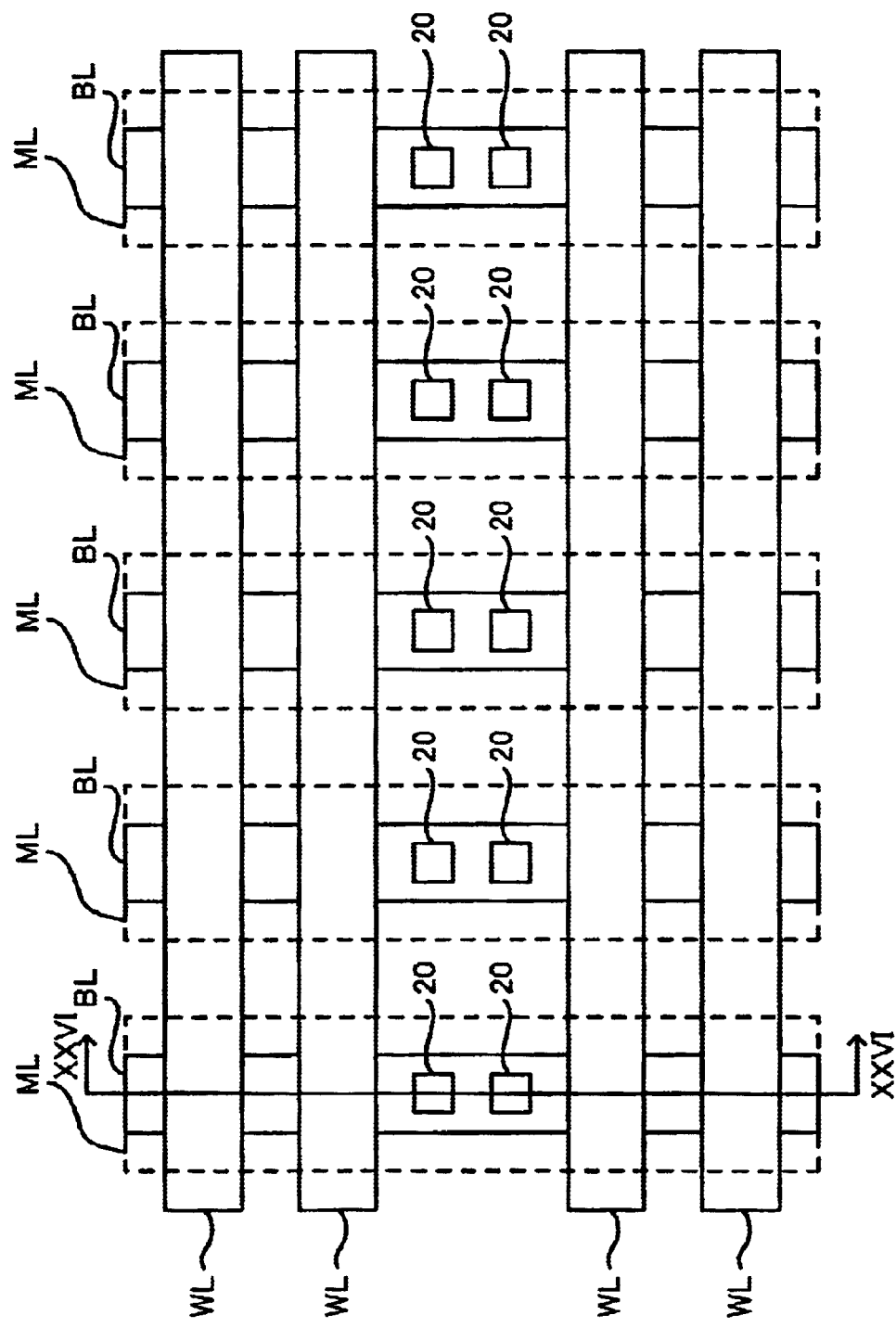
FIG. 25 is a plan view of conventional flash EEPROM.
Figure 26:
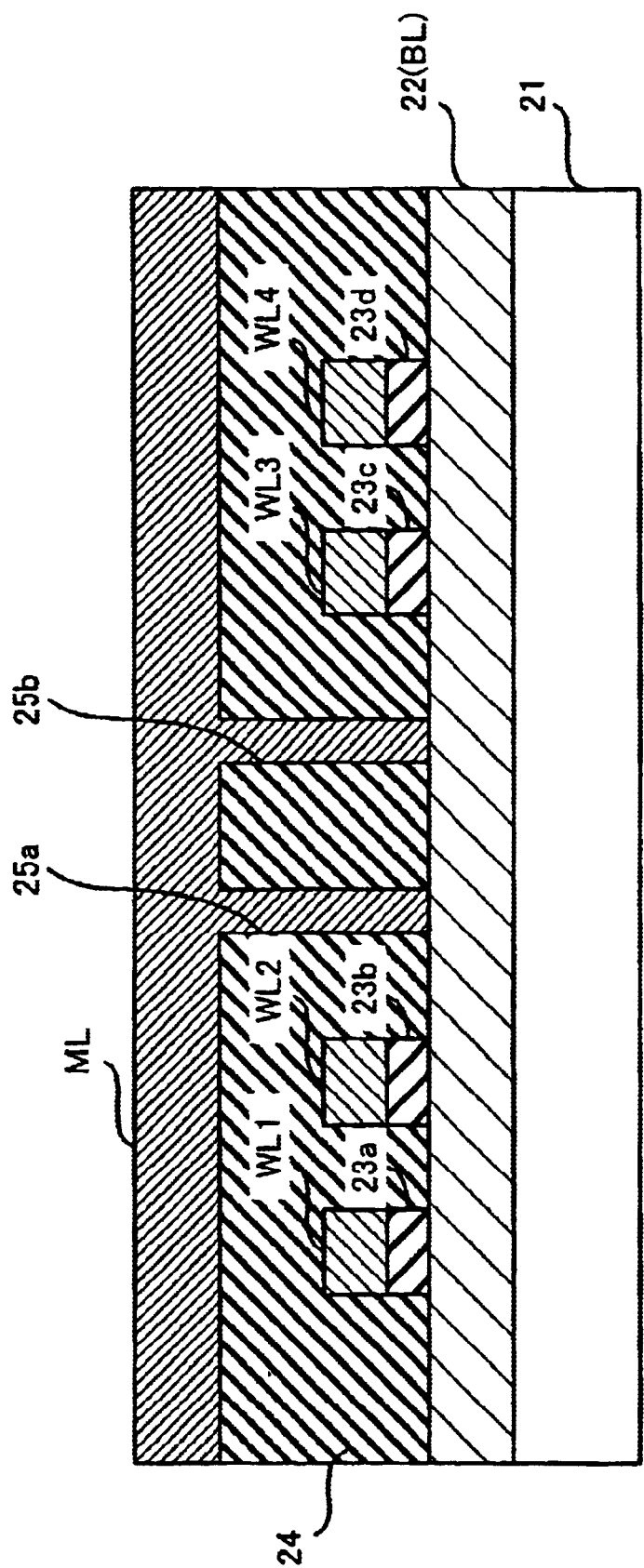
FIG. 26 is a cross-sectional view taken along line XXVI—XXVI of FIG. 25.
Figure 27:
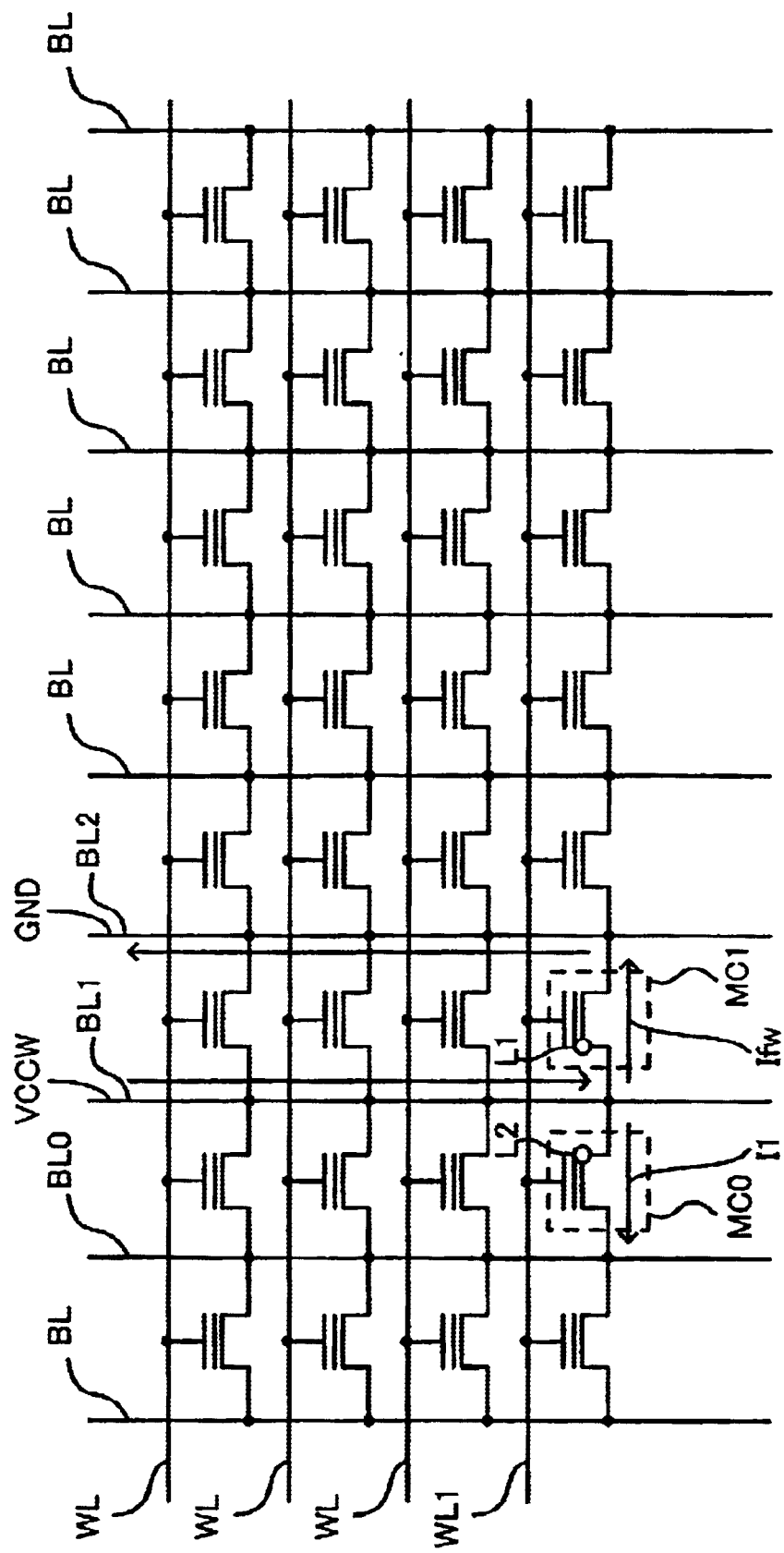
FIG. 27 is an explanatory view for a write operation for writing data to a nonvolatile memory call in the memory cell array shown in FIG. 23.

FIG. 22 is a plan view showing another example of the arrangement of metal lines in the memory cell array of the semiconductor memory device array.

Referring to FIG. 22, compared with FIG. 21, diffused bit lines BL11 and BL12 instead of diffused bit line BL1 are arranged and diffused bit lines BL21 and BL22 instead of diffused bit line BL2 are arranged.

Likewise, other diffused bit lines BL3 to BL6 are divided into diffused bit lines BL31 and BL32, BL41 and BL42, BL51 and BL52, and BL61 and BL62, respectively.

In FIG. 22, each diffused bit line shown in FIG. 21 is divided into two diffused bit lines and switch circuits SW82 to SW85, which supply the potentials of main bit lines to the respective bit lines, are newly added between the divided bit lines, respectively. By doing so, although the area of the memory cell array shown in FIG. 22 is increased from that of the memory cell array shown in FIG. 21, it is possible to accelerate the operating rate of the memory cell array.

With the above-mentioned configuration, in the semiconductor memory device in the embodiment of the present invention, it is possible to shorten the distance between the diffused bit lines in the memory cell array. As a result, it is possible to decrease the area of the memory cell array.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A semiconductor memory device comprising:
a plurality of word lines arranged in a row direction;
a plurality of bit lines arranged in a column direction;
a plurality of memory cells arranged in the row direction and the column direction;
a plurality of potential supply lines connected to a plurality of corresponding bit lines among said plurality of bit lines, respectively; and
a potential control circuit supplying a plurality of predetermined potentials corresponding to said plurality of bit lines through said plurality of potential supply lines, respectively, wherein
the plurality of memory cells arranged in said row direction are connected in series, and gates thereof are connected to the word line of said plurality of word lines arranged in the same row direction, and
each of said plurality of bit lines is connected to said plurality of memory cells arranged in the two adjacent columns.

2. The semiconductor memory device according to claim 1, wherein
said potential control circuit supplies a first predetermined potential to a first bit line connected to a selected memory cell, supplies a second predetermined potential to a second bit line connected to said selected memory cell, supplies said first predetermined potential to a third bit line adjacent to said first bit line, and supplies said second predetermined potential to a fourth bit line adjacent to said second bit line, among said plurality of bit lines.

3. A semiconductor memory device comprising:
a plurality of memory cell array blocks arranged in a column direction; and
a plurality of potential control circuits arranged in the column direction to correspond to said plurality of memory cell array blocks, wherein
each of said plurality of memory cell array blocks includes:
a plurality of word lines arranged in a row direction;
a plurality of bit lines arranged in the column direction; and
a plurality of memory cells arranged in the row direction and the column direction,
said plurality of memory cells arranged in said row directions are connected in series and gates thereof are connected to the word line of said plurality of word lines arranged in the same row direction,
each of said plurality of bit lines is connected to said plurality of memory cells arranged in the two adjacent columns,
one of two control circuits selected from said plurality of potential control circuits supplies a first predetermined potential to a first bit line connected to a selected memory cell of said plurality of memory cells and supplies a second predetermined potential to a second bit line, among said plurality of bit lines in the corresponding memory cell array block, and
the other potential control circuit adjacent to said potential control circuit supplies the second predetermined potential to said first bit line and supplies the first predetermined potential to said second bit line in the corresponding memory cell array block of said plurality of memory cell array blocks.

4. The semiconductor memory device according to claim 3, wherein
each of said plurality of potential control circuits includes:
a plurality of potential supply lines arranged according to said plurality of bit lines; and
a supply circuit supplying a plurality of predetermined potentials corresponding to said selected plurality of bit lines through said plurality of potential supply lines, respectively, and
an extension direction of said plurality of potential supply lines intersects an extension direction of said plurality of bit lines.

5. The semiconductor memory device according to claim 3, wherein
each of said plurality of potential control circuits includes:
a plurality of potential supply lines arranged according to said plurality of bit lines; and
a supply circuit supplying a plurality of predetermined potentials corresponding to said selected plurality of bit lines through said plurality of potential supply lines, respectively, and
said plurality of potential supply lines are arranged in parallel to said plurality of bit lines.

6. A semiconductor memory device comprising: a first conductive type semiconductor substrate having a main surface; and a memory cell array, wherein
said memory cell array includes:
a plurality of a first conductive layers of a second conductive type formed on said main surface of said semiconductor substrate, and arranged in a column direction;
a plurality of word lines arranged in a row direction;
a plurality of conductive lines formed above said plurality of word lines, arranged in the column direction, and each including a plurality of conductive segments;
a plurality of memory cells arranged to correspond to intersections between said plurality of word lines and said plurality of conductive lines, respectively; and
a plurality of pile driving sections formed on said first conductive layers, respectively, and
each of said plurality of pile driving sections includes:
a second conductive layer formed on each of said first conductive layers on said main surface of said semiconductor substrate; and
a plurality of contact sections formed between said second conductive layer and said plurality of conductive segments.

7. The semiconductor memory device according to claim 6, wherein
when the conductive segment of said plurality of conductive segments is formed on one of the two adjacent conductive layers, a center line of said conductive segment relative to an extension direction of said conductive segment is located toward a center line side on which the adjacent conductive layer is extended rather than a center line of the conductive layer connected to said conductive segment through said plurality of contact sections, and
when the corresponding conductive segments are formed on the two adjacent conductive layers, respectively, the center line of the conductive segment on one of the adjacent conductive layers relative to the extension direction of the conductive segment is located toward the conductive line side on the other conductive layer rather than the center line of the conductive layer connected to the conductive segment through said plurality of contact sections relative to the extension direction of the conductive segment.

* * * * *